United States Patent
Zundel et al.

(10) Patent No.: US 7,615,847 B2
(45) Date of Patent: Nov. 10, 2009

(54) METHOD FOR PRODUCING A SEMICONDUCTOR COMPONENT

(75) Inventors: Markus Zundel, Egmating (DE); Franz Hirler, Isen (DE); Ralf Siemieniec, Villach (AU)

(73) Assignee: Infineon Technologies Austria AG (AT)

( * ) Notice: Subject to any disclaimer, the term of this patent is extended or adjusted under 35 U.S.C. 154(b) by 130 days.

(21) Appl. No.: 11/690,494

(22) Filed: Mar. 23, 2007

(65) Prior Publication Data

US 2008/0230833 A1     Sep. 25, 2008

(51) Int. Cl.
*H01L 29/861* (2006.01)
(52) U.S. Cl. .......................... 257/607; 257/15; 430/542
(58) Field of Classification Search .................. 257/15, 257/607; 430/542
See application file for complete search history.

(56) References Cited

U.S. PATENT DOCUMENTS

| | | | |
|---|---|---|---|
| 4,941,026 A | 7/1990 | Temple | |
| 5,637,898 A | 6/1997 | Baliga | |
| 5,895,952 A | 4/1999 | Darwish et al. | |
| 5,973,360 A | 10/1999 | Tihanyi | |
| 6,262,453 B1 * | 7/2001 | Hshieh | 257/341 |
| 6,528,355 B2 | 3/2003 | Hirler et al. | |
| 6,545,316 B1 | 4/2003 | Baliga | |
| 6,787,848 B2 * | 9/2004 | Ono et al. | 257/328 |
| 6,885,062 B2 | 4/2005 | Zundel et al. | |
| 7,345,342 B2 * | 3/2008 | Challa et al. | 257/341 |
| 2002/0125532 A1 * | 9/2002 | Eisele et al. | 257/344 |
| 2003/0094624 A1 | 5/2003 | Hshieh et al. | |
| 2006/0211179 A1 | 9/2006 | Siemieniec et al. | |

FOREIGN PATENT DOCUMENTS

| | | |
|---|---|---|
| DE | 100 55 446 A1 | 7/2001 |
| DE | 100 07 415 A1 | 9/2001 |
| DE | 102 07 309 A1 | 9/2003 |
| DE | 103 61 135 A1 | 7/2005 |
| DE | 10 2005 009 000 A1 | 9/2006 |
| EP | 1 168 455 A2 | 1/2002 |
| WO | WO-01/01484 A2 | 1/2001 |

* cited by examiner

*Primary Examiner*—Thanh V Pham
*Assistant Examiner*—Caleb Henry
(74) *Attorney, Agent, or Firm*—Dickstein, Shapiro, LLP.

(57) ABSTRACT

A semiconductor component having a semiconductor body having first and second semiconductor regions of a first conduction type, and a third semiconductor region of a second conduction type, which is complementary to the first conduction type. The second semiconductor region is arranged between the first and third semiconductor region and together with the first semiconductor region forms a first junction region and together with the third semiconductor region forms a second junction region. In the second semiconductor region the dopant concentration is lower than the dopant concentration in the first semiconductor region. The dopant concentration in the second semiconductor region along a straight connecting line between the first and third semiconductor regions is inhomogeneous and has at least one minimum between the first and second junction regions, wherein the minimum is at a distance from the first and second junction regions.

14 Claims, 15 Drawing Sheets

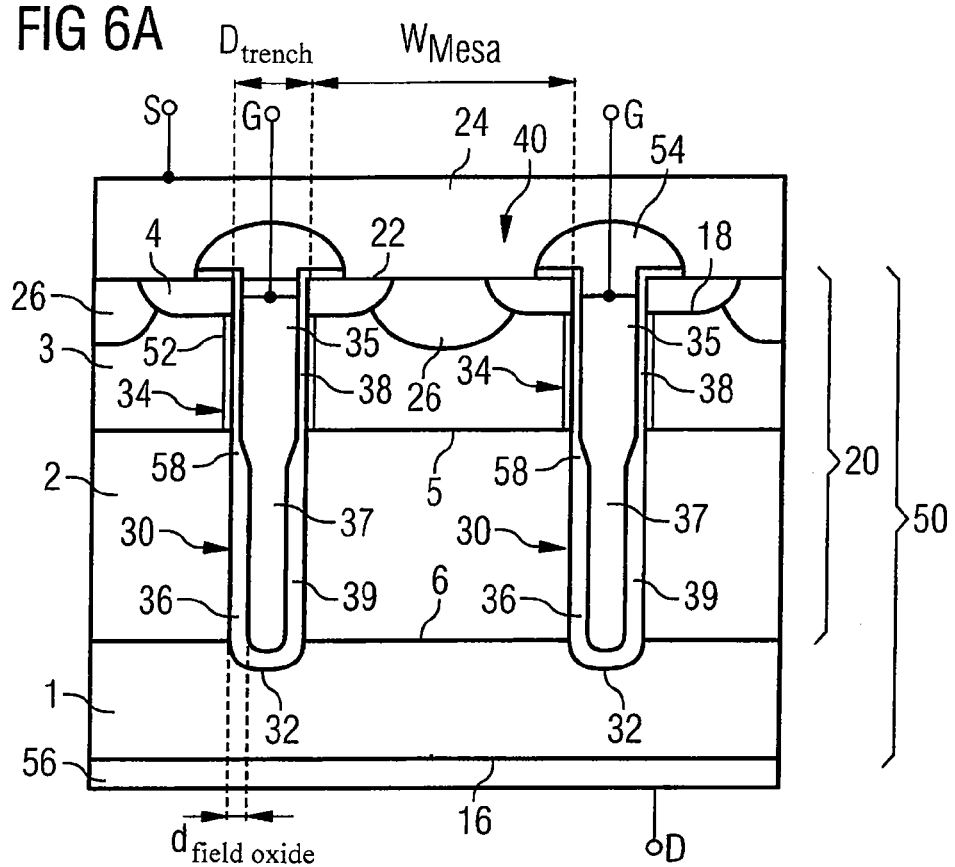
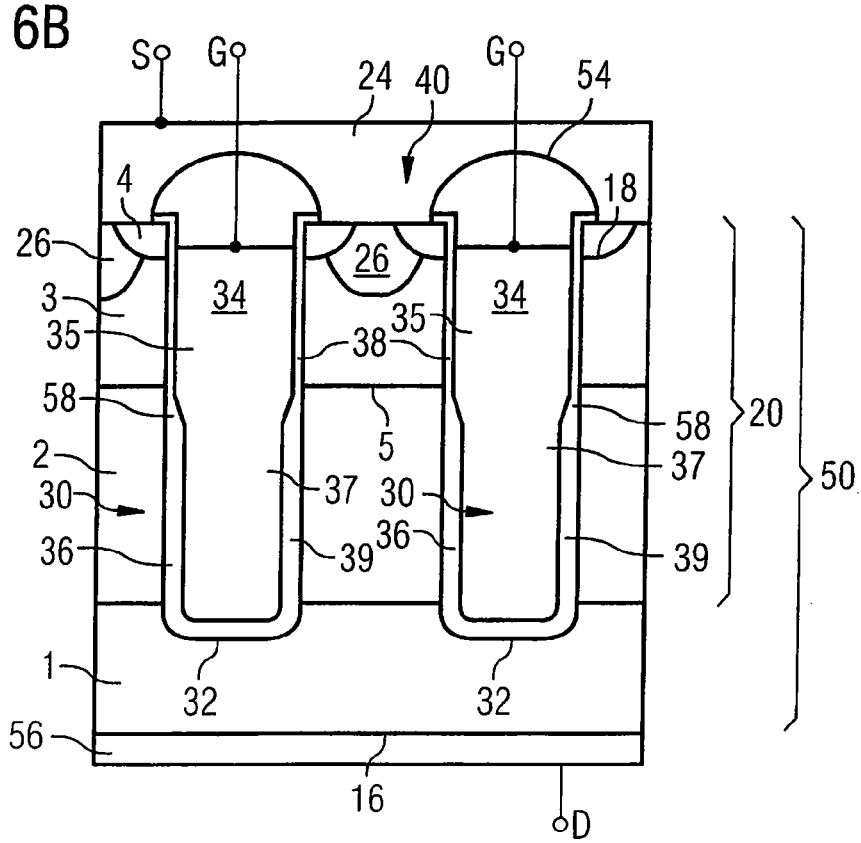

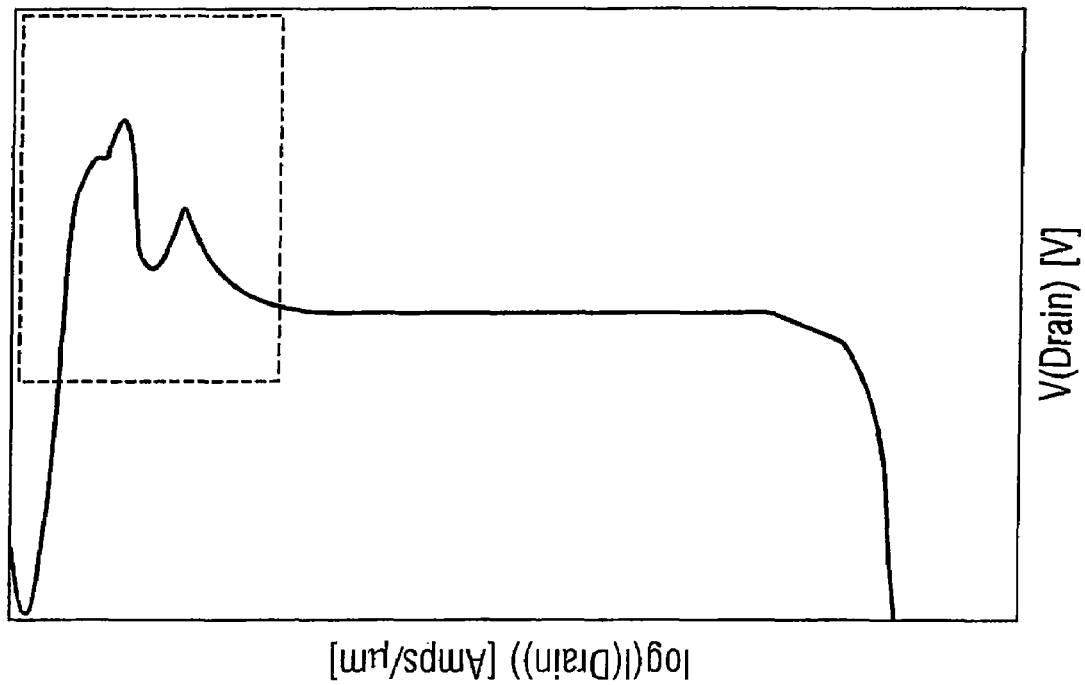
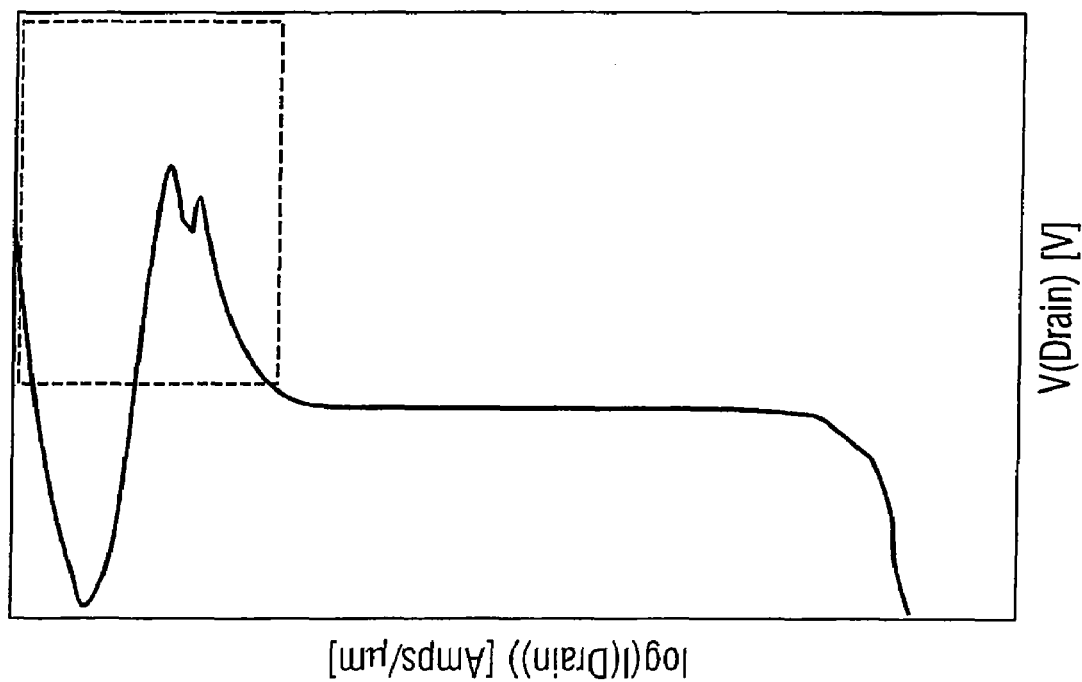

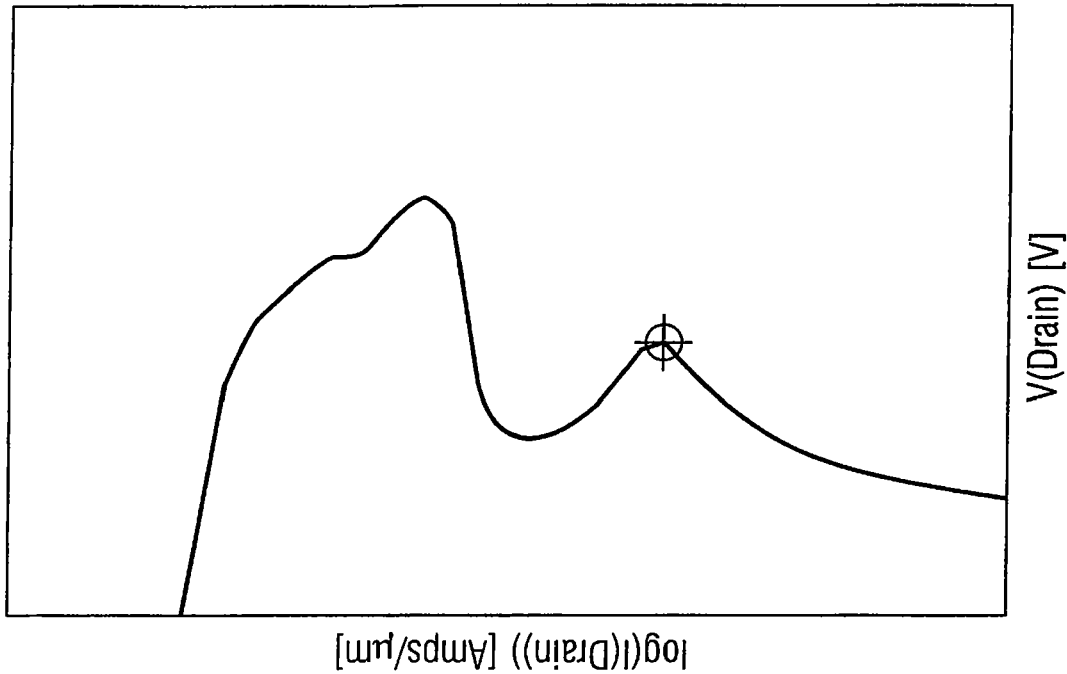
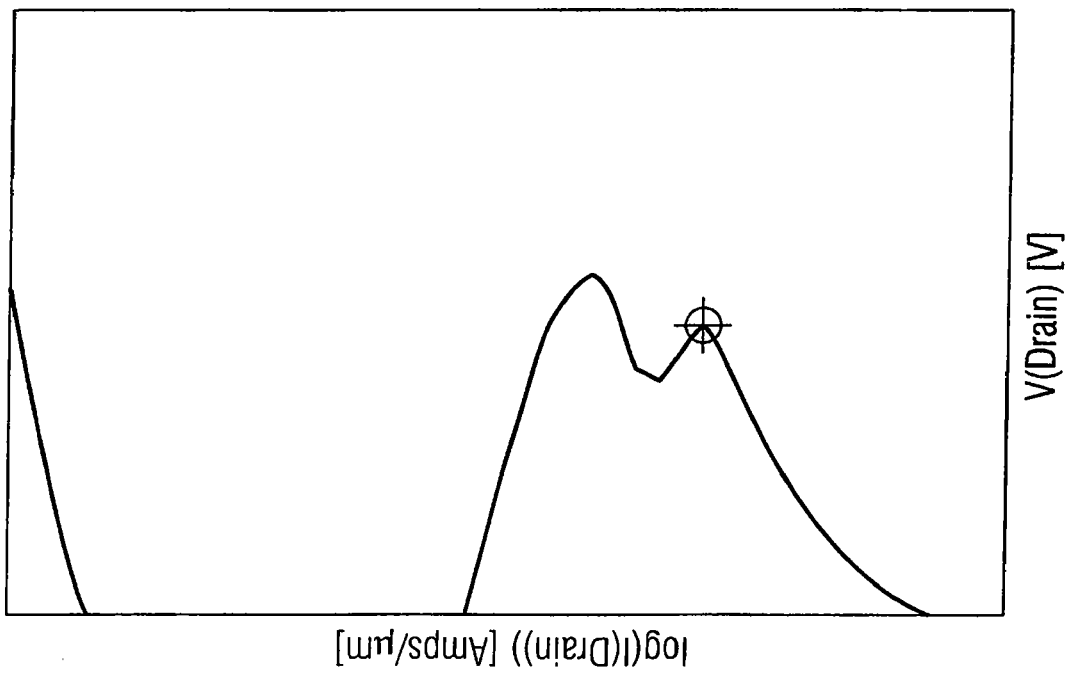

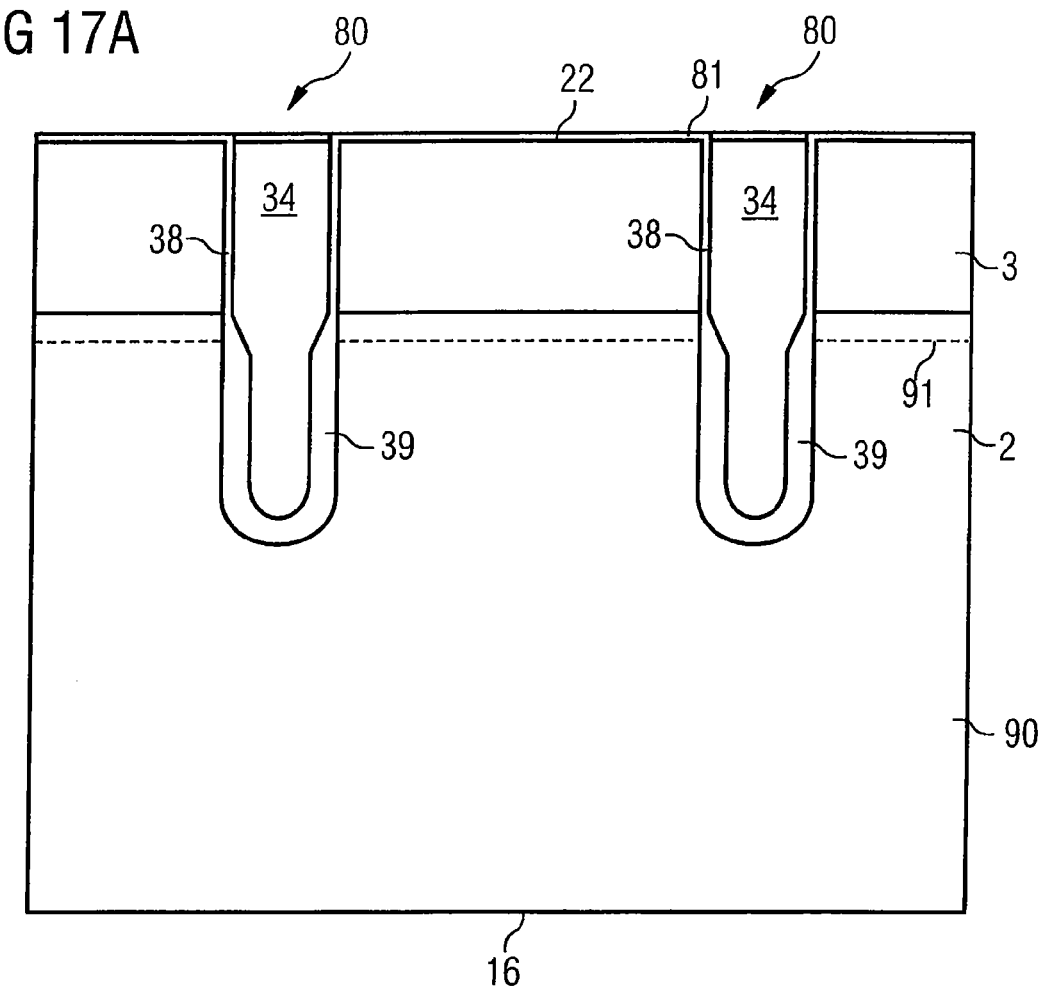
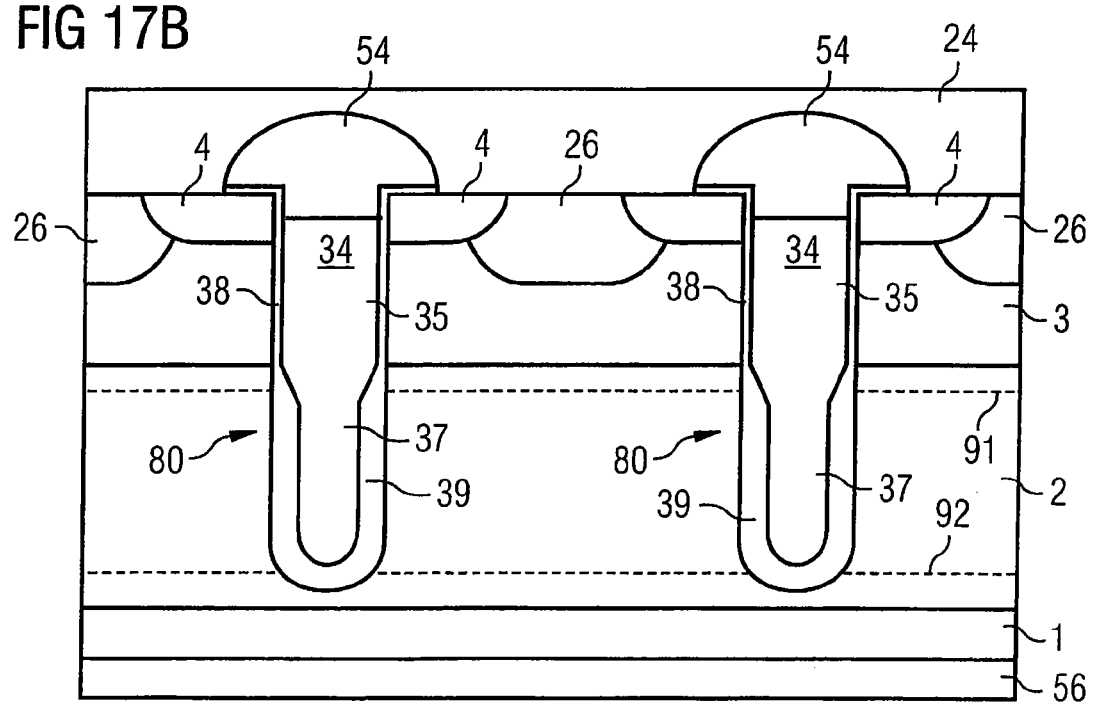

US 7,615,847 B2

METHOD FOR PRODUCING A SEMICONDUCTOR COMPONENT

BACKGROUND OF THE INVENTION

An important goal in the development of new generations of DMOS power transistors is to reduce the on resistivity $R_{on}*A$. As a result of this it is possible on the one hand to minimize the static power loss; on the other hand it is possible to achieve higher current densities, whereby smaller and less expensive chips can be used for the same total current. However, a very good avalanche strength is furthermore also required for the off-state case. Measures for reducing the on resistivity often bring about an impairment of the avalanche behavior, however.

SUMMARY

One embodiment provides a semiconductor component having a semiconductor body having at least one first semiconductor region of the first conduction type, at least one second semiconductor region of the first conduction type and at least one third semiconductor region of the second conduction type, which is complementary to the first conduction type. The second semiconductor region is arranged between first and third semiconductor region and together with the first semiconductor region forms a first junction region and together with the third semiconductor region forms a second junction region. The dopant concentration in the second semiconductor region is lower than the dopant concentration in the first semiconductor region. The dopant concentration in the second semiconductor region is furthermore inhomogeneous along a straight connecting line between first and third semiconductor region and has at least one minimum between first and second junction region, wherein the minimum is at a distance from the first and second junction region.

A further embodiment provides a semiconductor component having a semiconductor body having at least one first semiconductor region of the first conduction type, at least one second semiconductor region of the first conduction type and at least one third semiconductor region of the second conduction type, which is complementary to the first conduction type. The second semiconductor region is arranged between first and third semiconductor region and together with the first semiconductor region forms a first junction region and together with the third semiconductor region forms a second junction region. The dopant concentration in the second semiconductor region is lower than the dopant concentration in the first semiconductor region. The second semiconductor region has a compensation doping of the second conduction type with at least one maximum between first and second junction region, wherein the compensation doping at the maximum has a dopant concentration which is lower than the dopant concentration of the first conduction type in the second semiconductor region.

In a further embodiment, a power component has a silicon semiconductor body having a body region, a drain zone, and a drift zone, which is arranged between the body region and drain zone and together with the body region forms a pn junction, wherein the drift zone has a dopant concentration in the region of the pn junction or at the pn junction, which dopant concentration satisfies the following inequality:

$n > 1.13*10^{17}$ cm$^{-3}$*exp($-V_{br}/85$ V), where $V_{br}$ is the breakdown voltage.

BRIEF DESCRIPTION OF THE FIGURES

The invention is described below on the basis of embodiments which are shown in the appended figures and from which further advantages and modifications emerge. However, the invention is not restricted to the embodiments described in concrete terms, but rather can be modified and varied in a suitable manner. It lies within the scope of the invention to combine individual features and combinations of features of one embodiment with features and combinations of features of another embodiment in a suitable manner in order to arrive at further embodiments according to the invention.

Embodiments relate generally to semiconductor components. They specifically relate to power components, and in particular power components with an at least partly vertical current flow. Furthermore, embodiments relate to methods for producing a semiconductor component.

FIGS. 6A and 6B show embodiments of a vertical power transistor with trench structures.

FIG. 7B shows an enlarged excerpt from FIG. 7A.

FIGS. 8A and 8B show excerpts from simulation results of the breakdown characteristic curve of a power transistor, where FIG. 8B shows the breakdown characteristic curve for a power transistor with a dopant minimum in the second semiconductor region and FIG. 8A shows it for a comparative transistor without a minimum in the second semiconductor region.

FIGS. 9A and 9B show excerpts from FIGS. 8A and 8B.

FIGS. 17A and 17B show individual method steps of a further method for producing a semiconductor component.

DETAILED DESCRIPTION

A number of embodiments will be explained below. In this case, identical structural features are identified by identical reference symbols in the figures. In the context of the present description, "lateral" or "lateral direction" should be understood to mean a direction or extent that runs parallel to the lateral extent of a semiconductor material or semiconductor body. A semiconductor body is typically present as a thin wafer or chip and comprises two areas situated on opposite sides, one area of which is designated as main area. The lateral direction thus extends parallel to these surfaces. In contrast thereto, the term "vertical" or "vertical direction" is understood to mean a direction that runs perpendicular to the main area and thus to the lateral direction. The vertical direction therefore runs in the thickness direction of the wafer or chip.

The embodiments are described predominantly on the basis of n-channel power transistors. However, the embodiments are not restricted thereto and can also be formed as p-channel power transistors. Further possible embodiments include diodes, bipolar transistors and IGBTs. Therefore, the invention is not restricted to power transistors.

The structures shown in the figures are not depicted true to scale but rather serve only for the better understanding of the embodiments.

Figure 1:
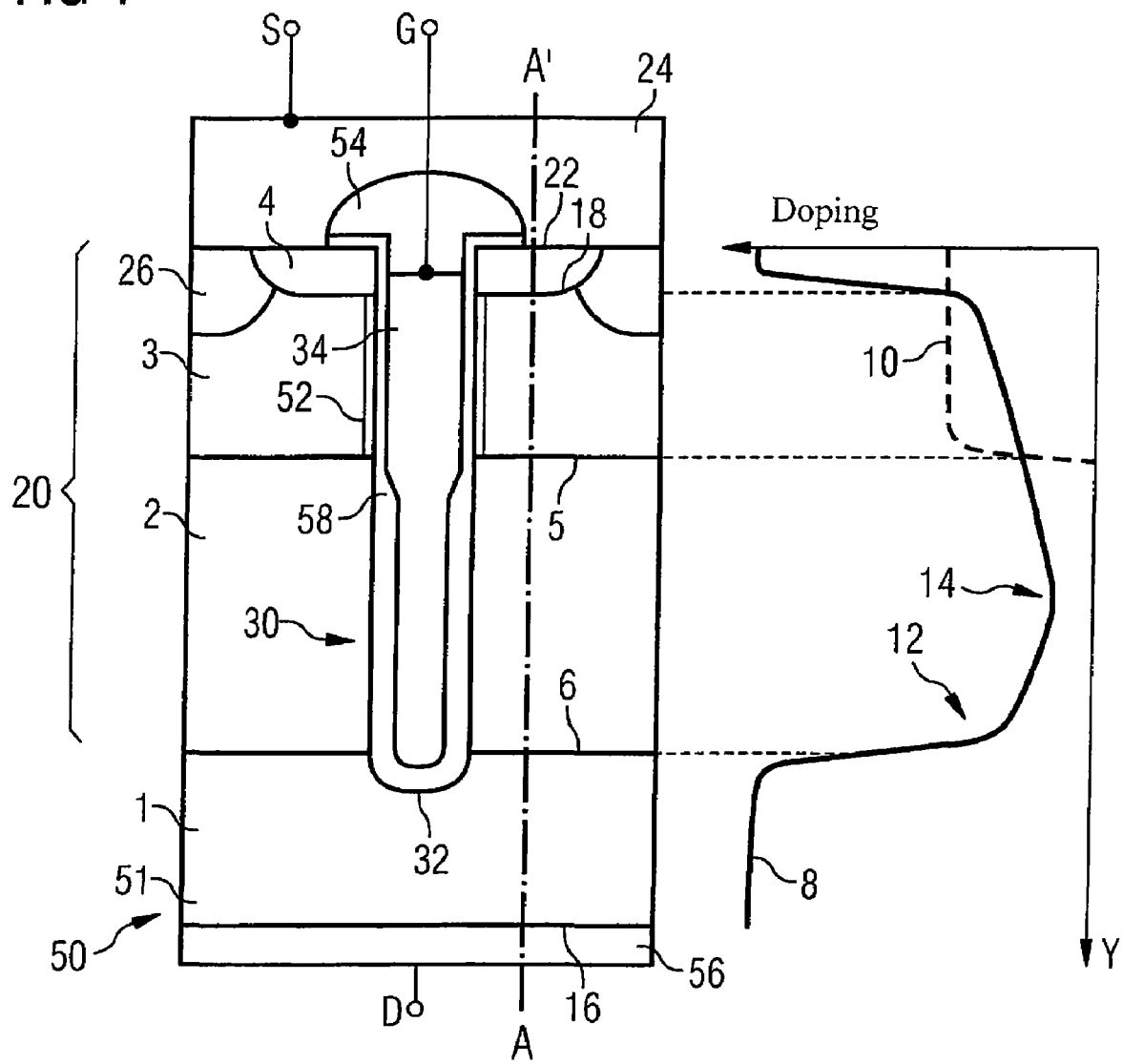
FIG. 1 shows a semiconductor component having a first, second and third semiconductor region on the basis of the example of a power transistor with a trench structure, wherein the dopant concentration in the second semiconductor region has a minimum.
Figure 2:
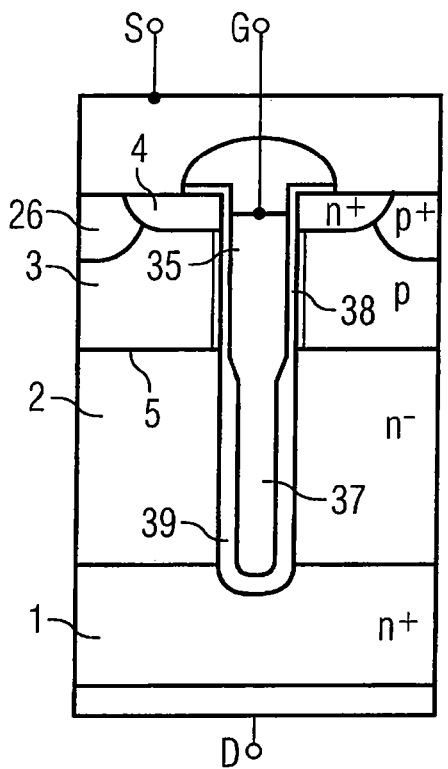
FIGS. 2 to 5 show different embodiments of power transistors with trench structures.

FIG. 1 shows, on the basis of a vertical field effect power transistor, a semiconductor component having a semiconductor body 50 having a first semiconductor region 1, a second semiconductor region 2 and a third semiconductor region 3. The first and second semiconductor regions 1 and 2 are of the first conduction type and n-conducting in the present case. By contrast, the third semiconductor region 3 is of the second conduction type, which is complementary to the first conduction type, and p-conducting in the present case. Consequently, a pn junction 5 is formed at the interface between n-conducting second semiconductor region 2 and p-conducting third semiconductor region 3. By contrast, the junction between first semiconductor region 1 and second semiconductor region 2 is referred to as $nn^+$ junction 6. If the first and second semiconductor regions 1, 2 are p-conducting, by contrast, the junction is a $pp^+$ junction. The pn junction 5 is a rectifying junction, while $nn^+$ and $pp^+$ junctions are not rectifying junctions.

In the present embodiment, the semiconductor body 50 comprises silicon. Other materials such as, for example, silicon carbide (SiC) or compound semiconductors are likewise suitable.

The first semiconductor region 1 has a significantly higher dopant concentration in comparison with the second semiconductor region 2, the first semiconductor region 1 typically having a substantially constant $n^+$-type doping. In this case, the difference in the dopant concentration between first semiconductor region 1 and second semiconductor region 2 may be more than one order of magnitude and typically 2 to 3 orders of magnitude.

In contrast thereto, the second semiconductor region 2 has an inhomogeneous doping and has a minimum between the $nn^+$ junction 6, which here represents the first junction region, and the pn junction 5, which here represents the second junction region. The minimum is at a distance both from the $nn^+$ junction 6 and from the pn junction 5, for example approximately 5%-50% from the pn junction 5 and 50%-95% from the $nn^+$ junction 6. In one embodiment, the minimum is at a distance of approximately 10%-30% from the pn junction 5 and 70%-90% from the $nn^+$ junction 6. In this case, the percentages relate to the thickness of the second semiconductor region 2 in the vertical direction, where the thickness is set at 100%. The thickness of the second semiconductor region 2 in the vertical direction lies approximately between 0.5 μm and 20 μm, and in particular between 1 μm and 8 μm. The minimum may therefore be arranged approximately in that half of the second semiconductor region 2 which faces the third semiconductor region 3. In the case of a comparatively thick second semiconductor region 2, the minimum may even be arranged in the upper third of the second semiconductor region 2 that faces the third semiconductor region 3. In the case, the semiconductor region 2 has its lowest dopant concentration in the region of the minimum. The minimum therefore forms a primary minimum or a global minimum.

It is also possible for the second semiconductor region 2 to have a further (local) minimum in the region between pn junction 5 and $nn^+$ junction 6. Proceeding from the minimum (primary minimum), the dopant concentration typically rises both to the $nn^+$ junction 6 and to the pn junction 5 at least in sections or overall. In the region of the respective junctions 5, 6 or directly in the vicinity thereof, the second semiconductor region 2 has a higher dopant concentration than at its minimum (primary minimum). In one embodiment, therefore, the dopant concentration decreases substantially monotonically proceeding from the $nn^+$ junction 6 (first junction region) as far as the minimum and increases substantially monotonically from the minimum as far as the pn junction 5 (second junction region). This characteristic of the dopant concentration is shown schematically on the right alongside the structure of the semiconductor component in FIG. 1. It shows the profiles of the dopant concentrations of the first, second and third semiconductor region 1, 2, 3 along a straight connecting line indicated by the dashed line AA'. In this case, curve 8 illustrates the n-type doping profile, while curve 10 shows the p-type doping profile.

The n-type dopant concentration falls steeply in the region of the $nn^+$ junction 6 proceeding from the relatively high concentration in the first semiconductor region 1 until it undergoes transition to a rather flat characteristic at a point 12. Point 12 indicates approximately the end of the $nn^+$ junction, which is also referred to as substrate tail section. The n-type dopant concentration then falls further on average as far as the minimum 14 and then increases again on average proceeding from the minimum 14 as far as the pn junction 5. The n-type dopant concentration furthermore rises gradually in the third semiconductor region 3, but as background doping there since the p-type doping 10 is predominant there. At the junction between the third semiconductor region 3 and a fourth semiconductor region 4, the n-type doping increases greatly again and is the prevailing doping in the fourth semiconductor region 4, that is to say that the fourth semiconductor region is likewise n-conducting again. The dopant profiles are represented schematically relatively smoothly and monotonically here. Since the doping can be set by different methods, for example implantation or in situ doping, however, the characteristic may also be stepped and rather non-uniform. Independently of the concrete local characteristic, the dopant concentration in the second semiconductor region, proceeding from the minimum 14, may on average increase continuously both to the pn junction 5 and to the $nn^+$ junction 6 and is higher in the region of these junctions than at the minimum 14. In other words, the characteristic of the dopant concentration in the second semiconductor region 2 may be approximately V-shaped.

The profile of the dopant concentration relates to the concentration of the dopant of the first conduction type, which involves the majority charge carriers in the second semiconductor region. This is an n-type dopant in the present embodiment. The concentration of the n-type dopant or of the fixed n-type impurities therefore has a corresponding minimum in the second semiconductor region. The same effect that can be achieved with a minimum of the fixed majority charge carrier impurities can also be achieved by additionally introducing a compensation doping of the second conduction type in the second semiconductor region, that is to say that fixed impurities of the second conduction type are formed in addition to the fixed impurities of the first conduction type. The dopant concentration of the first conduction type can then for example also be kept constant or increase continuously from the first semiconductor region (from the bottom) to the third semiconductor region (toward the top). The compensation doping having a maximum attenuates the effect of the fixed impurities of the first conduction type in particular in the region of the maximum. The compensation doping is introduced into the second semiconductor region in such a way that the maximum is situated approximately where the minimum would also have been formed. A combination of minimum in the dopant concentration of the first conduction type and compensation doping is likewise possible.

Figure 16:
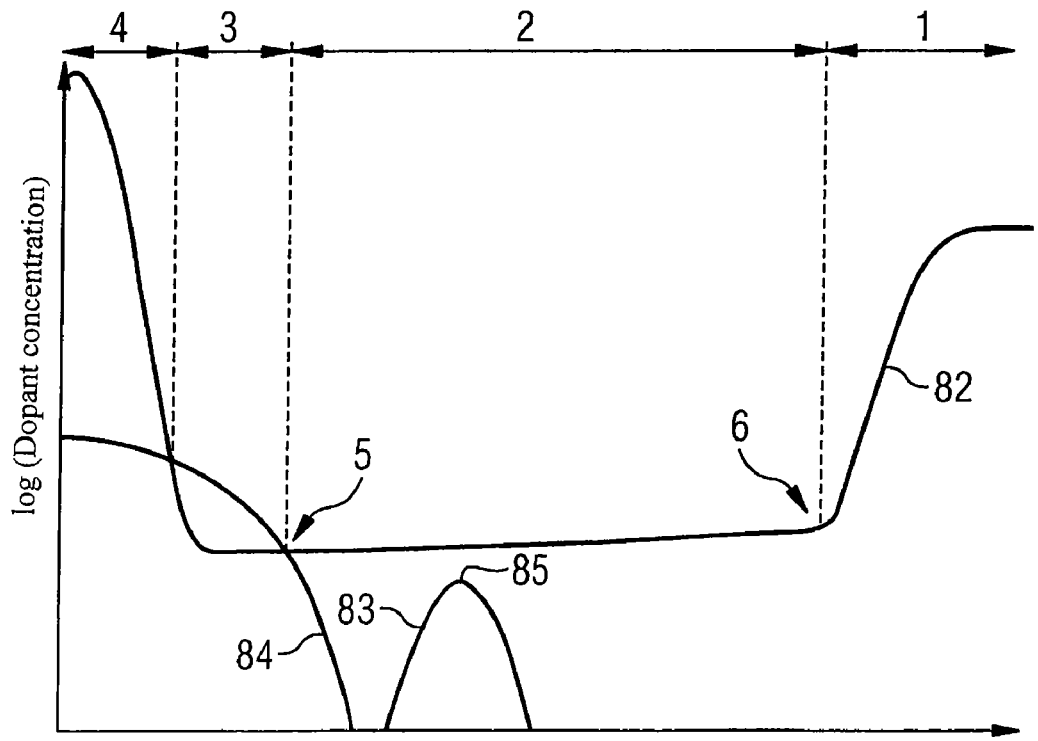
FIG. 16 shows a doping profile of a compensation doping with a maximum in the second semiconductor region.

An example of a profile of a compensation doping is shown in FIG. 16. In this case, the profile may likewise run along the line AA' shown in FIG. 1. In FIG. 16, 82 designates the profile of the dopant concentration of the first conduction type (n-conducting in the present exemplary embodiment). In the region of the second semiconductor region 2, the dopant concentration falls slightly in the direction of the third semiconductor region 3 without the formation of a minimum. 84 designates the profile of the dopant concentration of the second conduction type, which leads to the formation of the third semiconductor region 3. Curve 84 therefore corresponds to the curve 10 in FIG. 1. A compensation doping 83 of the second conduction type is additionally introduced into the second semiconductor region 2. The compensation doping 83 has a maximum, which is, in each case, at a distance from the $nn^+$ junction 6 and pn junction 5. The maximum 85 may be arranged in that half of the second semiconductor region 2 which faces the third semiconductor region 3, and in particular in the region specified above where the minimum would alternatively have been formed. As can be discerned from FIG. 16, the dopant concentration of the compensation doping in the second semiconductor region 2 is lower than the dopant concentration of the first conduction type. It goes without saying that the embodiments described further below may likewise have a compensation doping without the formation of a minimum in the doping profile of the first conduction type.

The dopant concentration (dopant concentration of the first conduction type) in the second semiconductor region 2 may be greater than $2*10^{16}$ cm$^{-3}$, and in particular greater than $5*10^{16}$ cm$^{-3}$ in the vicinity of the pn junction 5 or at the pn junction 5. In one embodiment, the dopant concentration in the region of the pn junction 5 or at the pn junction 5 may even be greater than $8*10^{16}$ cm$^{-3}$. Such a high doping of the second semiconductor region 2 toward the pn junction 5 significantly improves the avalanche strength. By contrast, the dopant concentration in the second semiconductor region 2 in the vicinity of the $nn^+$ junction 6 or at the $nn^+$ junction 6 may be greater than $1*10^{17}$ cm$^{-3}$. In this case, the extent of the $nn^+$ junction 6 is determined by the comparatively high dopant concentration in the first semiconductor region, which leads to a "tail section" i.e. steep fall. "At" or "in the vicinity of the $nn^+$ junction" therefore means adjoining the tail section, i.e. approximately at the point 12 of the curve 8. The dopant concentration at the minimum 14 lies approximately between $7*10^{15}$ cm$^{-3}$ and $1*10^{17}$ cm$^{-3}$. If the dopant concentration at the minimum 14 is approximately $10^{17}$ cm$^{-3}$, the dopant concentration has correspondingly higher values in the vicinity of the junctions 5 and 6. By contrast, the first semiconductor region 1 may be doped approximately to $10^{19}$ cm$^{-3}$ to a few $10^{20}$ cm$^{-3}$.

The compensation doping may have at its maximum a dopant concentration which is up to approximately 90% of the dopant concentration of the first conduction type. By way of example, the dopant -concentration of the first conduction type may be largely constant and be approximately between $1*10^{16}$ cm$^{-3}$ and $1*10^{17}$ cm$^{-3}$. The compensation charge may then have a concentration of between $1*10^{15}$ cm$^{-3}$ and $9*10^{16}$ cm$^{-3}$ at its maximum.

In the embodiment shown in FIG. 1, the semiconductor body 50 extends in the lateral direction, that is to say from right to left in FIG. 1. FIG. 1 shows only an excerpt and the semiconductor body 50 continues further toward the left and right. The first, second and third semiconductor regions 1, 2, 3 are arranged in the semiconductor body 50 one above another in said order with regard to the lateral extent of the semiconductor body. In this case, the first semiconductor region 1 is typically formed by a monocrystalline semiconductor basic body 51, on one top side of which an epitaxial layer 20 is applied. The first, second and third semiconductor regions 1, 2 and 3 are formed in the epitaxial layer. The semiconductor body 50 thus comprises the semiconductor basic body 51 and also the epitaxial layer 20. At a first surface 22, the semiconductor body 50 has at least two trench structures 30 which run substantially perpendicular to the first surface 22 and extend from the first surface 22 through the third semiconductor region 3 at least as far as into the second semiconductor region 2. In this case, a mesa structure 40 remains between the trench structures 30. The two trench structures are shown in FIGS. 6A and 6B, for example.

In a plan view of the first surface 22, the trench structures 30 may be formed, for example as strip structures, as regularly arranged rectangles having more or less rounded corners or as grid structures.

By way of example, an electrode structure 34 is arranged in each trench structure 30, the electrode structure being insulated from the semiconductor body 50 and the semiconductor regions formed therein by at least one dielectric layer 36. As shown in the embodiment in FIG. 1, for example, the electrode structure 34 may be a gate electrode 35. In the region of the third semiconductor region 3, the dielectric layer 36 is made comparatively thin and there performs the function of a gate dielectric 38 between gate electrode 35 and third semiconductor region 3. In the region of the second semiconductor region 2, by contrast, the dielectric layer 36 is made considerably thicker and there performs the function of a field oxide 39. In this embodiment, the electrode structure 34 extends as far as the first semiconductor region 1 and serves as a field plate 37 in the region of the first and second semiconductor regions 1 and 2. The dielectric layer 36 may comprise one material or material combinations. An insulating oxide, for example, silicon oxide is typically used. However, different materials may also be used for producing gate dielectric 38 and field oxide 39. The field oxide may also grow very slowly in its thickness, as seen in the vertical direction, so that the complete thickness is reached only in the region of the trench bottom 32.

An $n^+$-doped fourth semiconductor region 4 is arranged in the semiconductor body 50 and in particular in the third semiconductor region 3, the fourth semiconductor region being spaced apart, here vertically, from the second semiconductor region 2. The fourth semiconductor region 4 is typically situated at a first surface 22 of the semiconductor body 50, reaches laterally as far as the trench structures 30 and typically forms the source region (source zone) of the power transistor. A pn junction 18 likewise forms between the fourth semiconductor region 4 and the third semiconductor region 3. The pn junction 5 is operated in the reverse direction. By contrast, the third semiconductor region 3 and the source region 4 are typically short-circuited, so that the pn junction 18 is bridged. The third semiconductor region 3 is typically referred to as body region. By contrast, the semiconductor region 2 constitutes a drift path (drift zone) between the body region 3 and the first semiconductor region 1, which is referred to as the substrate (semiconductor basic body 51) or drain region (drain zone). A channel 52 is formed in the third semiconductor region or body region 3 when a suitable voltage is applied to the gate electrode 35, the channel being indicated here by thin lines running vertically in the vicinity of the trench structures 30. A fifth semiconductor region 26, which is typically a highly-doped p-conducting body terminal region, is likewise formed at the first surface 22 of the semiconductor body 50 in the third semiconductor region 3. Body terminal region 26 and source region 4 are contact-connected by means of a metalization 24 situated on the first surface 22. An associated source terminal S is shown in FIG. 1. The electrode structure 34 is contact-connected via a gate terminal G, the electrode structure 34 being insulated from the metalization 24 by an insulation region 54. A rear side contact 56 is situated on a rear side 16 (second surface) of the semiconductor body 50 or of the semiconductor basic body 51 and here constitutes a drain-side contact-connection connected to a drain terminal D.

The formation of a dopant concentration minimum in the second semiconductor region increases the avalanche strength while at the same time improving the resistivity. This has a particularly favorable effect in the case of field plate trench transistors such as are shown by way of example in FIGS. 1 to 6B and 11 to 13. In one embodiment, therefore, the minimum is arranged on the one hand between the trench structures 30 and on the other hand between pn junction 5 and substrate tail section or bottom of the trench structures 30, i.e. above the bottom of the trench structures. The avalanche strength is improved particularly in the case of a comparatively small width of the mesa structure 40 in comparison with the width of the trench structures 34, while at the same time optimizing the on resistivity $R_{on}*A$. The width $W_{mesa}$ of the mesa structure 40, the width $D_{trench}$ of the trench structure 34 and also the thickness $d_{field\ oxide}$ of the dielectric layer 36 in the region of the field oxide 39 are indicated in FIG. 6A. In one embodiment $W_{mesa}<1.5*D_{trench}$ holds true. In other embodiments $W_{mesa}<1*D_{trench}$ or even $W_{mesa}<0.5*D_{trench}$ may hold true. Furthermore, the dielectric layer 36 may have a thickness $d_{field\ oxide}$ in the region of the second semiconductor region 2 where it acts as field oxide 39, so that $W_{mesa}<3*d_{field\ oxide}$ holds true. The properties of the power transistor can be optimized to an even greater degree by virtue of the comparatively small lateral extent of the mesa structure 40 between adjacent trench structures 34.

The trench structures 30 may extend in the vertical direction over more than half of the vertical extent of the drift zone 2, that is to say that the trench structures 30 penetrate through the majority of the drift zone 2. It is furthermore possible for the distance $d_1$ (FIG. 3) between the trench bottom 32 and the first semiconductor region (drain region) 1 to be less than or equal to the total width $W_{mesa}$ of the mesa structure 40, and in particular less than or equal to half the width of the mesa structure 40. This improves the effect of the field plates 37 on the drift zone 2 remaining below the trench structures 30, shifts a possible avalanche breakdown location further in the direction of drain region 1 and lowers the on resistivity $R_{on}*A$ for a given breakdown voltage.

The vertical extent of the drift zone 2 depends, inter alia, on the chosen voltage class (maximum reverse voltage) of the power transistor. By way of example, the drift zone may have an extent of approximately 0.5 µm to 2 µm in the case of a voltage class of 20 V and approximately 10 µm to 20 µm in the case of a voltage class of 200 V. These values hold true for silicon as semiconductor material. In the case of other materials, such as SiC, for example, the drift zone must be adapted accordingly.

The mesa structure 40 may have a width $W_{mesa}$ of between approximately 100 nm and 10 µm, and in particular between 200 nm and 5 µm. Typical values often lie in the range of 0.3 µm to 2 µm.

Figure 10:
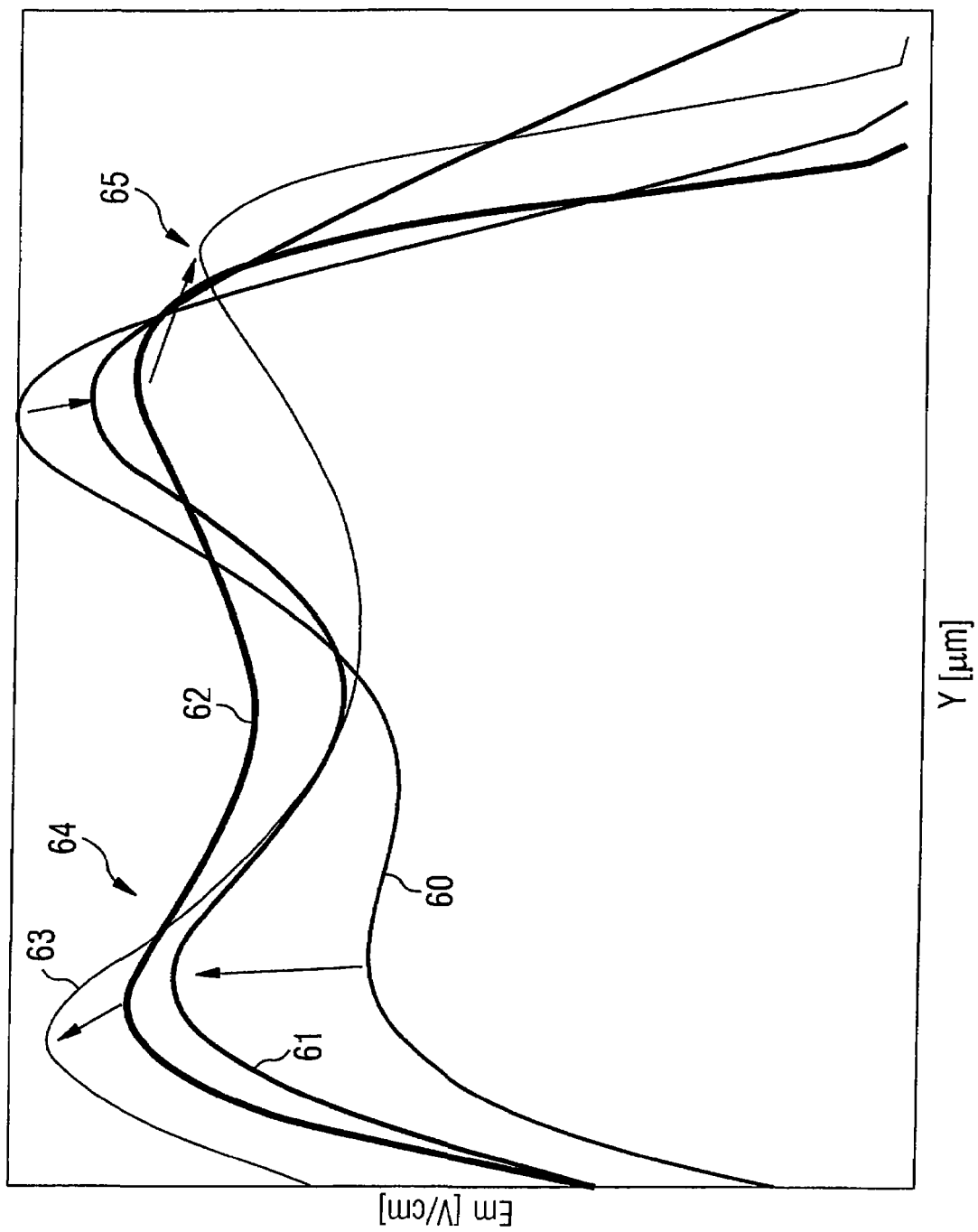
FIG. 10 shows the simulated distribution of the electric field strength along sectional lines through the center of the mesa structure of vertical power transistors.

In the case of a field plate trench transistor as shown in FIG. 1, for example, the characteristic of the electric field strength typically has two maxima. A simulated characteristic of the electric field strength distribution along a vertical connecting line between body region 3 and substrate 1 is illustrated in FIG. 10, wherein the junction with respect to the substrate 1 is on the right and the junction with respect to the body region 3 is on the left. In this case, the simulation was based on the doping profiles shown in FIGS. 7A and 7B. In this case, a first maximum 64 lies in the region of the pn junction 5, that is to say at the junction between body region 3 and drift zone 2. The first maximum 64 typically lies in the vicinity of a step 58 at the transition between gate dielectric 38 and field oxide 39. A second maximum 65 is typically situated in the bottom region of the trench structures 34. Curve 62 shows the characteristic of the electric field strength distribution for low current densities, while curve 63 represents the characteristic for high current densities. The shift in the maxima, which is identified by arrows here, when the current density is increased is clearly discernable. For comparison, the electric field strength distribution is illustrated in curve 60 for low current density and in curve 61 for high current density for the case where no minimum is formed in the drift zone 2. As the current density increases in the avalanche mode, the avalanche-generated charge carriers bring about a compensation of the background doping in the space charge zone of the pn junction 5 and hence a redistribution of the electric field. The voltage dropped across the power transistor in this case rises as the current density increases.

This situation is shown in FIGS. 8A and 8B, where FIG. 8A holds true for the case without a minimum in the drift zone and FIG. 8B holds true for the case with a minimum in the drift zone. Without wishing to be restrictive, the simulations shown in FIGS. 8A and 8B can be understood as follows. As current $I_{drain}$ rises, the voltage $V_{drain}$ increases as can be seen from the branch rising slightly from the bottom left. When the critical field strength is reached, the current rises very greatly on account of the avalanche-generated charge carriers. This situation is represented by the section running almost vertically upward. As a result of the increase in the free charge carriers, in particular as a result of the avalanche-generated charge carriers, the density of the free charge carriers reaches values which are comparable with the density of the background doping or even exceed the latter. The net charge density is therefore increasingly determined by the free charge carriers and leads to a compensation of the background doping. This results in a change in the distribution of the electric field, which FIG. 10 shows. The increase in the current density firstly leads to a rise in the primary maximum, as a result of which the breakdown voltage rises, but then, as the current density increases further, to a change in the maxima relative to one another, with the result that the previously smaller maximum becomes greater than the previous primary maximum. This phenomenon is referred to as "field flip-over" since, at the same time, the maximum voltage which is present across the component and which results as an integral over the field strength also decreases again as current densities increase. As a result, the breakdown voltage decreases, which leads to a failure of the component. In FIGS. 8A and 8B, the reduction of the breakdown voltage can be discerned from the first "nose" pointing toward the right.

In addition to this phenomenon, it is possible for the parasitic bipolar transistor that is inherent to every field effect transistor to trigger in the region of the "nose". In this case, minority charge carriers are injected into the body region 3 from the source region 4, the pn junction 18 of which with respect to the body region 3 is operated in the forward direction, which minority charge carriers contribute to a current flow through the pn junction 5 operated in the reverse direction between body region 3 and drain region 1. In this case, the source region 4 forms the emitter, the body region 3 forms the base and the drift zone 2 forms the collector of the parasitic bipolar transistor.

The parasitic bipolar transistor has a positive temperature coefficient, so that at high currents and hence high temperatures on account of the power loss, the parasitic bipolar transistor has an increasingly small electrical resistance and higher currents can thus flow. Field effect power transistors typically comprise many individual cells connected up in parallel. The parasitic bipolar transistor turns on typically at the "weakest" cells first. Since, as a result of the turn-on of the parasitic bipolar transistor at the cells, the resistance of the cells is reduced compared with the cells in which the bipolar transistor has not yet commenced, a significantly higher current flows through the cells with the turned-on parasitic bipolar transistor than through the other cells. This effect is also called current splitting. However, the current density that is thereby increased in the "weakest" cells inevitably leads to the destruction of the cells and hence of the entire component.

The formation of a minimum in the drift zone makes it possible to shift the turn-on of the parasitic bipolar transistor, which is also referred to as latching, and also the reduction of the breakdown voltage on account of the "field flip-over" toward higher current densities.

Comparison of FIGS. 9A and 9B, which show a partial excerpt from FIGS. 8A and 8B, reveals that the turn-on of the parasitic bipolar transistor and also the field flip-over have been shifted toward higher current densities in the case of power transistors having a minimum in the characteristic of the dopant concentration in the drift zone 2. The turn-on of the bipolar transistor is represented by a crosshair in FIGS. 9A and 9B. The course of the characteristic curve above this point results from the simulation, but does not represent a real characteristic since the components are generally destroyed when the parasitic bipolar transistor is turned on. In the case simulated here, it was possible to ascertain an increase in the current density by approximately 58%. The maximum avalanche current per cell thus grows by the same magnitude. The table below gives an overview of the simulation results on the basis of a comparison between cells with and without a minimum in the doping profile in the drift zone.

|  | Cells without minimum in the drift zone | Cells with minimum in the drift zone | Improvement |
|---|---|---|---|
| Characteristic of the doping profile in the drift zone | Maximum | Minimum | |
| $U_{br}$ [V] (Breakdown voltage) | 100% | 115% | Increase by 15% |
| $R_{on}$ * A per cell [mΩ mm²] | 100% | 82% | 18% decrease (or even more after $U_{br}$ adjustment) |
| Avalanche current per cell [10⁻⁴ A] | 100% | 158% | 58% increase |

It has proved to be favorable, for example, to form the minimum of the dopant concentration in the drift zone 2 approximately in the upper half between the trench structures 30 and the pn junction 5 and the nn⁺ junction 6. It has furthermore proved to be favorable for the minimum to be formed above the bottom 32 of the trench structures 30. Proceeding from the minimum, the doping rises in particular in the region of the trench structures 30 both downward to the substrate 1 and upward to the body region 3. In this case, the characteristic of the doping profile relates to a straight line connecting the first semiconductor region to the third semiconductor region. In the case of vertical power transistors, the connecting line runs vertically through the mesa structure 40 outside the trench structures 30.

The doping of the drift zone 3 may be formed in such a way that the region of the minimum extends laterally between adjacent trench structures 30, is arranged only at the edge (in the region of the vertical side wall of the trench structure 30) or else only in the center (as seen in the lateral direction) of a mesa structure 40. In the last case, the dopant concentration even increases slightly in the lateral direction from the mesa center to the trench structures 30. Accordingly, the doping profile of the drift zone may be inhomogeneous both in the lateral direction and in the vertical direction. Typically, however, the doping profile is predominantly homogeneous in the lateral direction. The homogeneous doping in the lateral direction results substantially from the production methods used, for example the in-situ doping during the deposition of the second semiconductor region 2. Therefore, generally speaking, the doping profile of the second semiconductor region 2 may be formed inhomogeneously in a first direction and substantially homogeneously in a second direction running perpendicular to the first direction, a dopant concentration minimum being formed in the first direction.

As described above, power transistors can fail both as a result of latching and as a result of a decrease in the breakdown voltage. Both frequently take place at very similar current densities, but are based on different causes. In order simultaneously to improve the destruction of power transistors both as a result of latching and as a result of a decrease in the breakdown voltage, therefore, as described here, the dopant concentration in the drift zone 2 is raised both upward to the pn junction 5 and downward to the nn⁺ junction 6 proceeding from a minimum in the central region of the drift zone 2 and correspondingly increases.

The rising doping in the direction of the substrate 1 (drain direction) acts in the manner of a field stop. At low currents, the electric field is in this case limited by the extent of the space charge zone. In the case of a doping of the drift zone 2 that increases downward, that is to say toward the substrate 1, more and more avalanche-generated charge carriers are required in order to change the net charge. Consequently, even at higher current densities, the maxima of the electric field strength are shifted downward and upward, with the result that the power transistor can take up voltages at even higher current densities. The "field flip-over" is thereby delayed.

At the pn junction, the raised doping there also acts to the extent that the electric field must now penetrate into the body region to a greater degree. This brings about a shift in the avalanche generation in the direction of the body terminal region 26 in the central region of the mesa structure, so that the holes generate less voltage drop below the source region. This leads to an increase in the current density at which the parasitic bipolar transistor turns on.

A further advantage of the raised doping toward the body region 3 is an improvement in the spreading resistance, which describes the spreading out of the current from the channel over the width of the mesa structure 40. In addition, the raised concentration of the dopant concentration at the trench bottom reduces the on resistivity $R_{on}*A$. As a result of the specific characteristic of the dopant concentration in the drift zone 2, an overall better distribution of the electric field strength is achieved and the breakdown voltage is therefore even increased. Furthermore, an improvement in the storage charge of the inverse diode and also an improved chopping behavior can be expected. The reduction of the storage charge can be illustrated with reference to FIGS. 7A and 7B. In the case of curve 70 and curve 72, the ratio of $p^+/n$ at the pn junction and the ratio $n^+/n$ on the right-hand side in the region of the $nn^+$ junction is in each case greater than in the case of curves 71 and 73. This is associated with a higher emitter efficiency; on both sides, therefore, in the on-state case, better injection is effected and more excess charge carriers are pushed into the drift zone 2. The excess charge carriers then have to be extracted from the drift zone 2 again upon turn-off. As a result of the raised doping in the drift zone 2, by contrast, the flooded volume is decreased. The doping rising in the drain direction brings about a more continuous reduction of the stored charge during depletion of source region 2 in the drain direction, whereby the chopping behavior is improved.

Figure 7A:
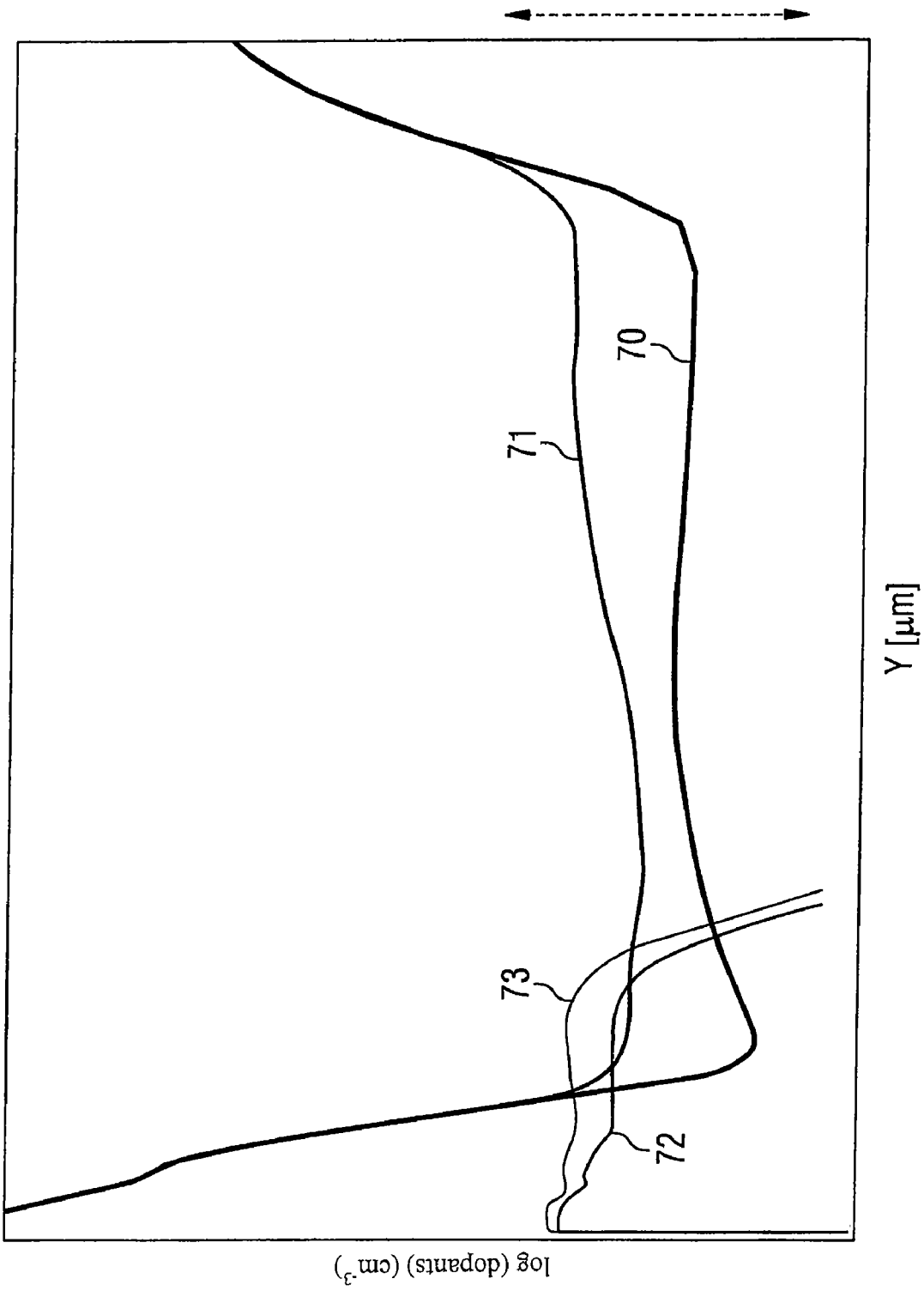
FIGS. 7A and 7B show profile characteristics of the dopant concentration in the first, second and third semiconductor region along a vertical line, as indicated in FIG. 6A, where
Figure 7B:
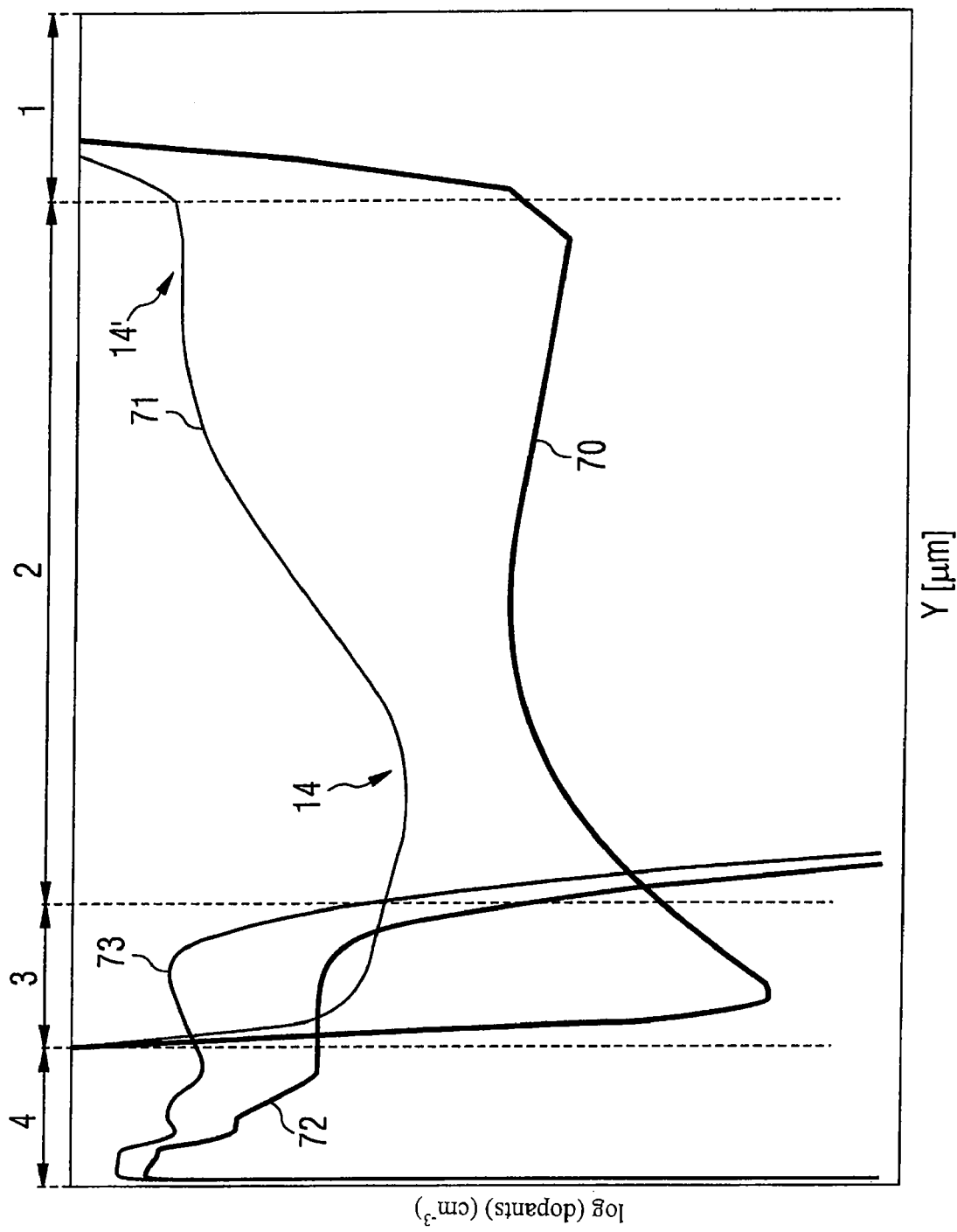

The distribution of the dopant concentration on which the simulation results shown in FIGS. 8A, 8B, 9A, 9B and 10 were based is illustrated in FIGS. 7A and 7B, where FIG. 7B illustrates an enlarged partial excerpt (identified by a dashed arrow in FIG. 7A) from FIG. 7A. The vertical extent of the first to fourth semiconductor regions 1, 2, 3 and 4 is indicated by arrows in FIG. 7B. In this case, curve 71 indicates the characteristic of the n-type doping with a minimum 14 in the drift zone 2. By contrast, curve 70 shows an n-type doping without a minimum, in the present case even with a maximum in the drift zone 2. Curves 72 and 73 show the p-type doping in the body region 3, where curve 72 is associated with curve 70 and curve 73 with curve 71. A weakly formed secondary minimum 14' can even be discerned toward the substrate 1 in curve 71.

Figure 3:
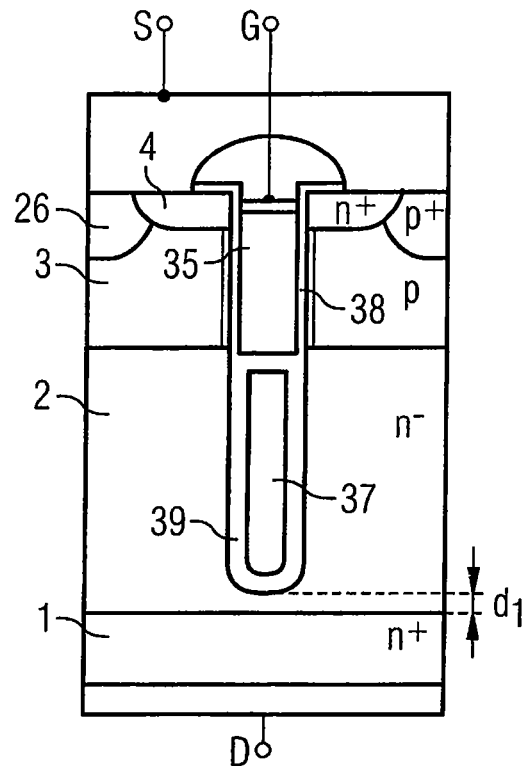
Figure 4:
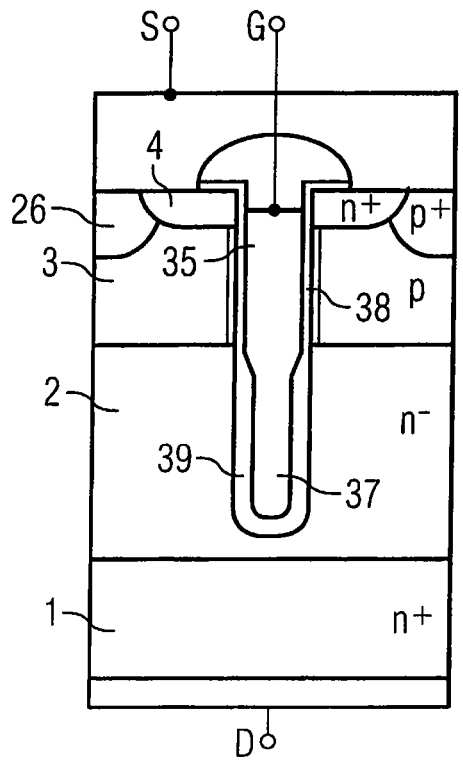
Figure 5:
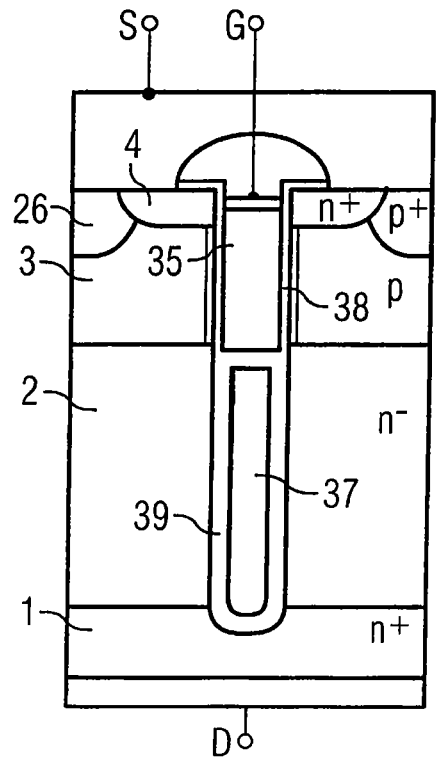

The trench structure 30 can (FIG. 2), but need not, extend as far as the substrate 1. This is illustrated in FIGS. 3 and 4, for example. Furthermore, the trench structure 30 may have a field plate 37 electrically insulated from the gate electrode 35, which field plate is then typically at source potential (FIGS. 3 and 5).

Figure 11:
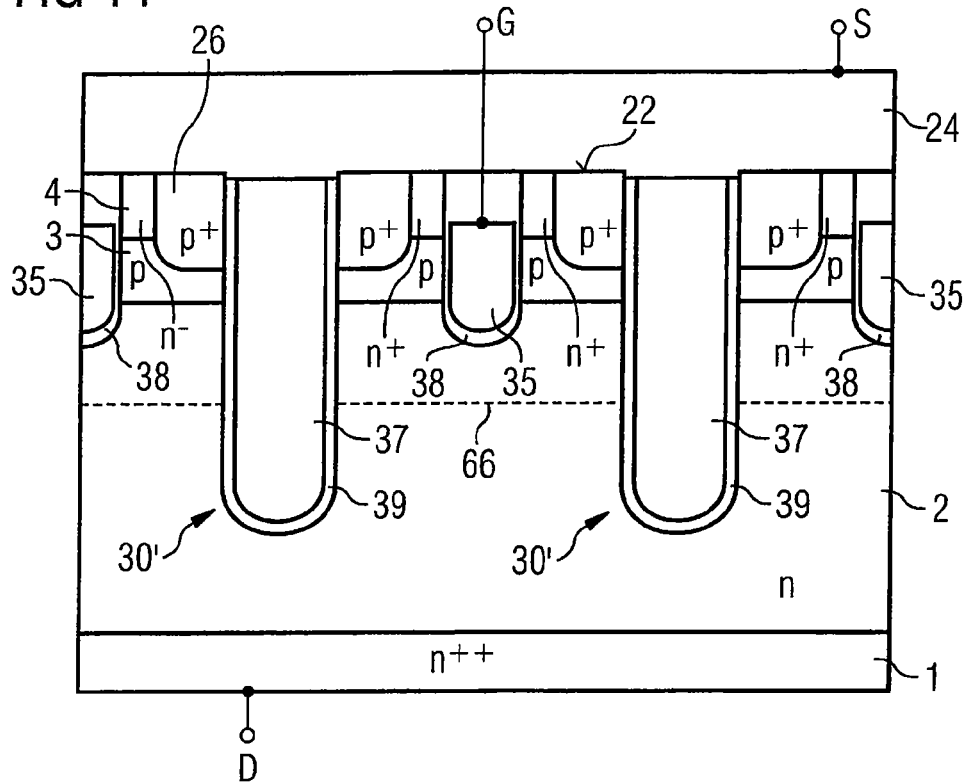
FIG. 11 shows a further embodiment of the invention on the basis of a power transistor with a vertical channel.

FIG. 11 illustrates a further embodiment of a semiconductor component. In contrast to the embodiments shown in FIGS. 1 to 4, here gate electrode 35 and field plate 37 are accommodated in separate trench structures 30, 30', a gate electrode 35 being arranged approximately centrally between adjacent field plates 37. The second semiconductor region 2 which is arranged in an epitaxial layer or a monocrystalline semiconductor substrate, has a minimum in the dopant concentration which is formed, as seen in the vertical direction, approximately in the upper half of the second semiconductor region 2. In this case, the minimum may extend laterally between the field plates 37. The position of the minimum is indicated by 66 in FIG. 11.

Figure 12:
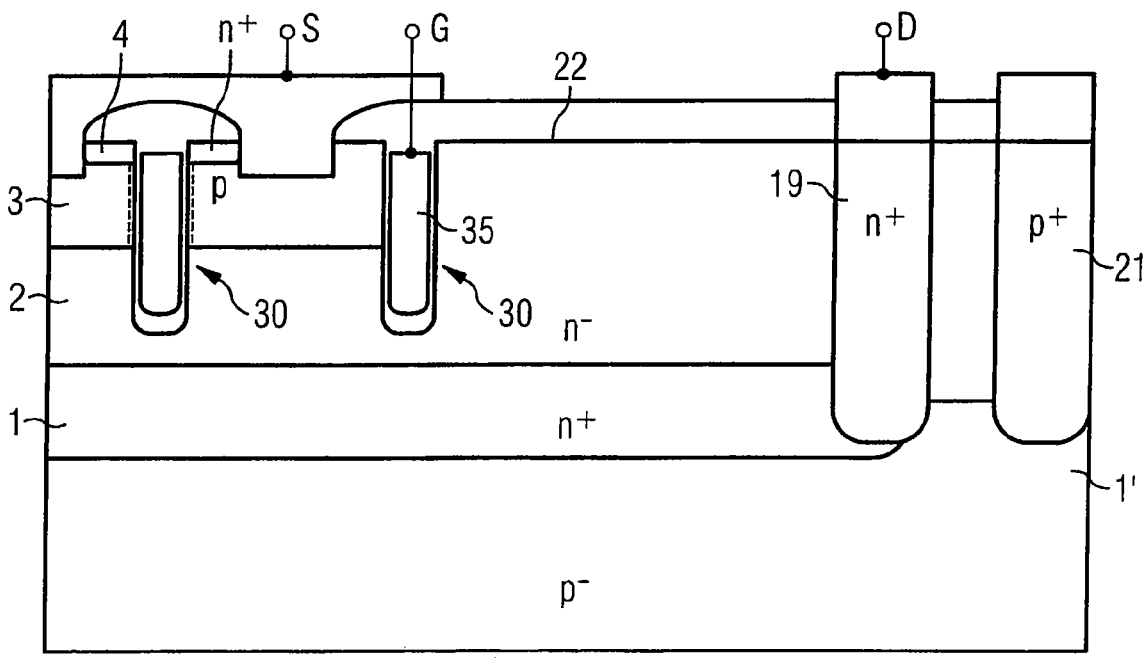
FIG. 12 shows a further embodiment with a buried drain zone which is contact-connected from the top side via a terminal region.

FIG. 12 shows a further embodiment, in which the drain region 1 is formed as a buried layer. For this purpose, the semiconductor body 51 has a weakly p-doped semiconductor substrate 1', in which the drain region 1 is formed. The buried drain region 1 can be contact-connected from the first surface 22 via an $n^+$-doped sinker or drain terminal region 19. The drift zone 2, the body region 3 and the source region 4 are arranged above the drain region 1. Trench structures 30 reaching right into the drift zone are likewise provided, gate electrodes 35 being arranged in the trench structures. The drift zone here likewise has a doping profile with minimum.

Figure 13:
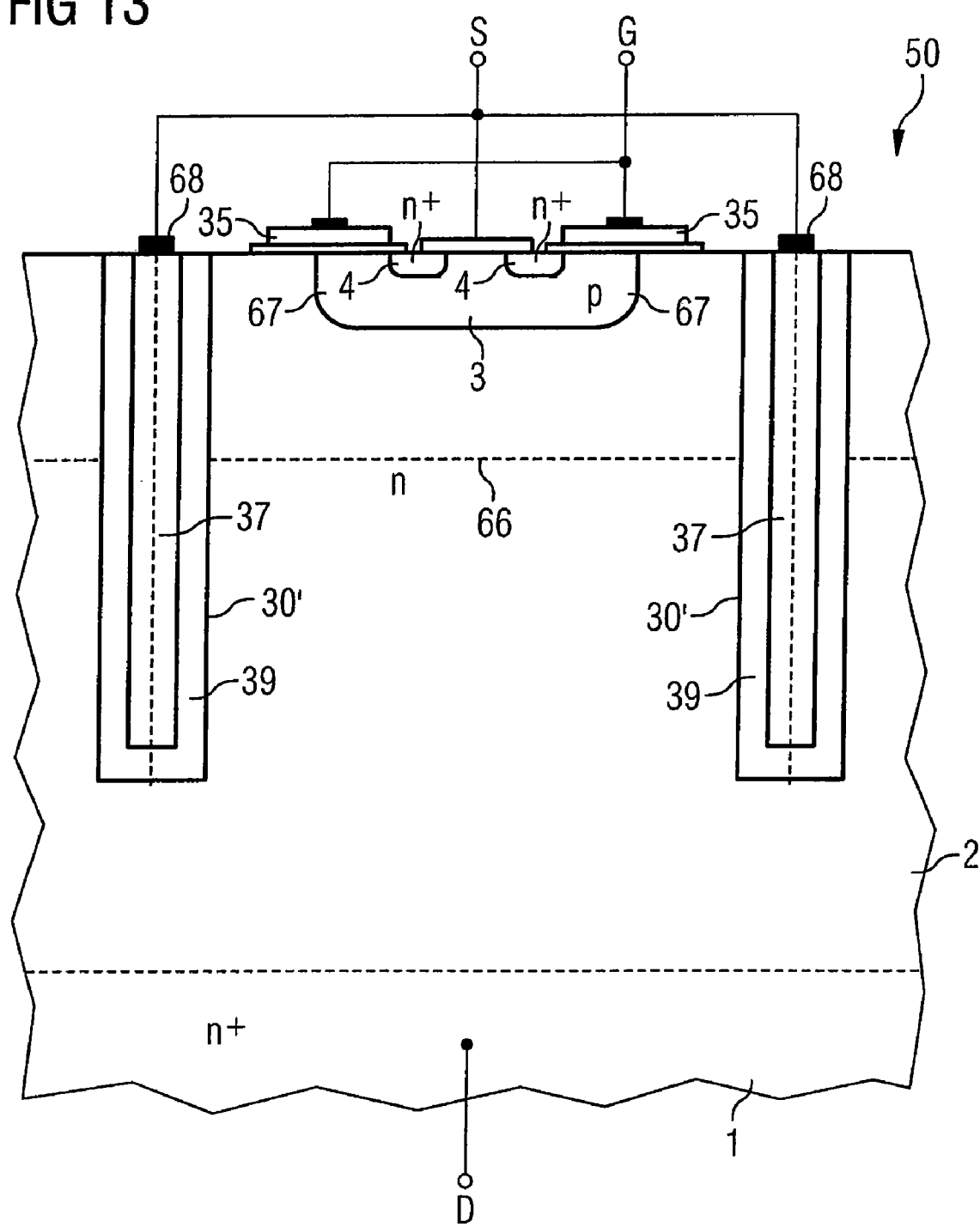
FIG. 13 shows a further embodiment of the invention on the basis of a power transistor with a lateral channel and a partly vertical current flow.

A further embodiment is shown in FIG. 13. In the case of the semiconductor component shown there, the gate electrode 35 is not arranged in a trench structure, but rather on the top side of the semiconductor body 50, with the result that a conductive channel 67 is formed in the lateral direction in the body region 3. The current flow is therefore lateral in this region, but undergoes transition to a vertical current flow in the drift zone 2 since here, as also in the case of the embodiments shown in FIGS. 1 to 4, the drain region 1 lies below the drift zone 2. Field plates 37 are arranged in trench structures 30' and are connected to the source terminal S via contact-connections 68. Here, the drift zone 2 is likewise doped inhomogeneously in the vertical direction and has a minimum 66 in the upper half and, if the drift zone 2 has a particularly large vertical extent, even in the upper third of the drift zone 2.

The formation of a minimum in the drift zone is not restricted to the embodiments described here, but can also be applied to power transistors having a different construction.

Figure 15:
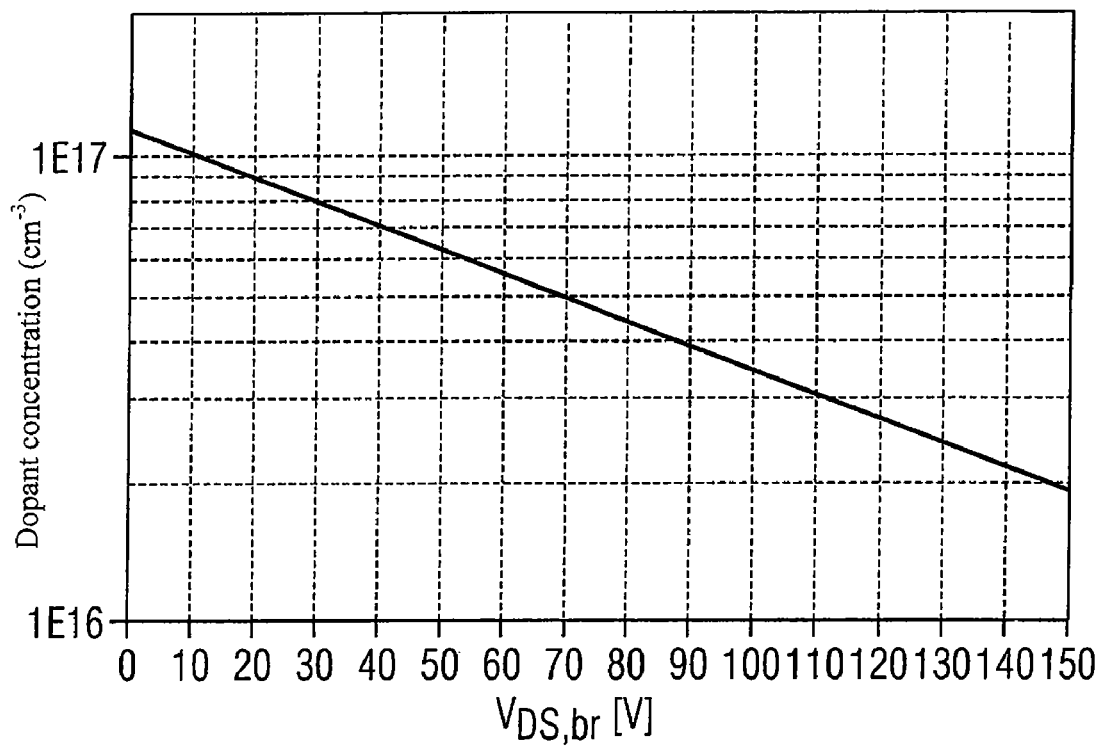
FIG. 15 shows the relationship between the dopant concentration in the vicinity of the junction between second and third semiconductor region and the breakdown voltage.

In accordance with a further embodiment, the second semiconductor region 2 has, in proximity to the third semiconductor region 3, a dopant concentration that satisfies the following inequality:

$$n > 1.13*10^{17} \text{ cm}^{-3} * \exp(-V_{br}/85 \text{ V})$$

where $V_{br}$ is the breakdown voltage. This inequality describes the dopant concentration in silicon. The breakdown voltage $V_{br}$ can be determined for example for a current density of 10 µA/mm². The relationship between the dopant concentration, which here is that of the first conduction type, is shown in FIG. 15, wherein the breakdown voltage $V_{DS,br}$ (defined as breakdown voltage between source and drain) is plotted on the abscissa and the dopant concentration is plotted on the ordinate. The above inequality predefines the magnitude of the dopant concentration of the first conduction type in the vicinity of or at the pn junction with respect to the third semiconductor region for a breakdown voltage to be achieved. The above inequality defines the dopant concentration in particular only in the range between 10 V and 200 V and very particularly only in the range between 20 V and 150 V; that is to say that in particular only semiconductor components whose breakdown voltage lies within the ranges are defined by the above inequality.

The high dopings for a given breakdown voltage have the effect, in particular, that the parasitic bipolar transistor triggers only at comparatively high current densities. Moreover, this measure reduces the on resistivity $R_{on}*A$.

Suitable methods for producing a semiconductor component with a minimum of the dopant concentration in the drift zone will be described below.

Generally, a first semiconductor region 1 of the first conduction type, a second semiconductor region 2 of the first conduction type having a lower dopant concentration than the first semiconductor region 1, and a third semiconductor region 3 of the second conduction type, which is complementary to the first conduction type are formed. In this case, the semiconductor regions are formed in such a way that the second semiconductor region 2 is arranged between first and third semiconductor region and together with the first semiconductor region 1 forms a first junction region 6 and together with the third semiconductor region 3 forms a second junction region 5. The second semiconductor region 2 is furthermore formed in such a way that it has an inhomogeneous dopant profile of the first conduction type along a straight connecting line between first and third semiconductor region 1 and 3 with at least one minimum between first and second junction region 5 and 6, wherein the minimum is at a distance from the first and second junction region 5 and 6. As an alternative or in addition, it is possible to form, in the second semiconductor region 2, a compensation doping of the second conduction type with at least one maximum between first and second junction region 5 and 6, wherein the compensation doping has at the maximum a dopant concentration which is lower than the dopant concentration of the first conduction type in the second semiconductor region.

The inhomogeneous dopant profile of the first conduction type can be set by epitaxial deposition of a semiconductor layer onto a substrate with suitable variation of the supplied dopants during deposition and an optional thermal step. The compensation doping can also be introduced into the semiconductor layer during the epitaxial deposition of the semiconductor layer. In this case, it is possible to dispense with the formation of a minimum in the dopant profile of the first conduction type.

It is likewise possible to form the inhomogeneous dopant profile by implantation of dopants of the first conduction type or of protons into a semiconductor body. The compensation doping can likewise be produced by implantation.

Concrete examples of production methods are described below with reference to FIGS. 14A to 14D and 17A to 18B.

Firstly, provision is made of a semiconductor basic body 51 composed, for example, of highly n-doped monocrystalline silicon, which subsequently forms the first semiconductor region 1. An epitaxial layer (semiconductor layer) 20 composed of silicon, for example, is grown onto the semiconductor basic body 51. The second and third semiconductor region 2, 3 and also the fourth and fifth semiconductor region 4, 5 are subsequently formed in the epitaxial layer 20. During the deposition of the epitaxial layer 20 or by means of suitable subsequent measures, an inhomogeneous doping profile is formed in the epitaxial layer 20 with a minimum in a region representing the drift zone (second semiconductor region).

The inhomogeneous doping profile in the epitaxial layer 20 can be achieved for example by varying the concentration of the dopant supplied during the deposition. The epitaxial layer 20 is thus doped in situ. A phosphorus-, antimony- or arsenic-containing compound can be supplied for an n-type doping; a boron-containing compound, for example, can be supplied for a p-type doping. In concrete terms, in this case, firstly the concentration of the supplied dopant can be continuously reduced during a first time segment proceeding from an initial value down to a minimum value and then be kept largely constant at the minimum value, for example, for a second time segment. The concentration can subsequently be increased again during a third time segment. As an alternative, it is possible to dispense with raising the concentration in the third time segment and instead, to bring about a rise in the dopant concentration after the completion of the epitaxial layer 20 in conjunction with an outdiffusion step or a high-energy implantation by means of a suitable implantation into the epitaxial layer 20. Since the third semiconductor region (body region) 3 is formed in subsequent steps in upper regions of the epitaxial layer 20, the first to third time segments relate to the time period during the deposition of the epitaxial layer 20 in which the lower region of the epitaxial layer 20 is formed, which lower region subsequently defines the drift zone 2. By contrast, the region of the epitaxial layer 20 in which the body region 3 and also the source region 4 and the body terminal region 26 are formed is deposited in a fourth time segment following the third time segment. The concentration of the supplied dopant is typically kept constant in the fourth time segment. In order to provide a suitable dopant concentration in the surface region for an edge termination, the dopant concentration can also be lowered or raised. The above-described implantation, also referred to as amplifying implantation, is therefore performed in such a way that dopant is introduced for instance into the junction region between drift zone 2 and body region 3 or somewhat below the body region 3 that is subsequently to be formed. The pn junction 5 forms later in this region. This process implementation has the advantage that the extent of the body region 3 and thus of the channel can be defined better. Using a mask, the amplifying implantation can also be effected selectively only at selected regions. It is thus possible, by way of example, for the cell array and the chip edge of a power transistor to be treated differently. By way of example, it is therefore possible to produce correspondingly lightly doped surface regions at the chip edge.

The dopant concentration can also be varied in stepwise fashion. A smoothed profile arises from the stepped profile as a result of subsequent furnace processes.

Figure 14A:
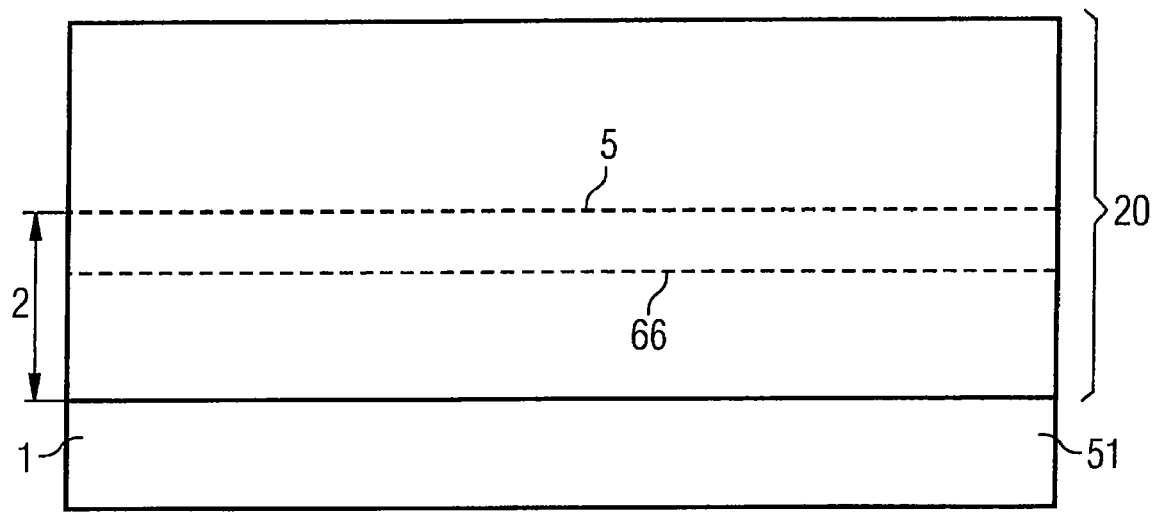
FIGS. 14A to 14D show individual method steps for producing a semiconductor component with a dopant minimum in the second semiconductor region.

The position of the pn junction 5 produced in later steps and also the position of the minimum 66 are indicated in FIG. 14A, as is the extent of the drift zone 2.

As an alternative, it is possible to reduce the concentration of the supplied dopant only during a first time segment or during the entire deposition and then further to leave it constant. Afterward (FIG. 14B), trenches 80 are then etched into the epitaxial layer 20 and optionally partly into the semiconductor basic substrate 51. The uncovered surface 22 and also the uncovered surface in the trenches 80 are subsequently thermally oxidized. An oxide layer 81 is thereby formed, which represents the dielectric layer 36. The oxide layer 81 is made thicker in the lower region of the trenches. This can be achieved by means of a two-stage process implementation, by way of example. By means of the oxidation of the uncovered surface regions, dopant is driven out or segregated from the regions. The segregated dopants diffuse into the epitaxial layer 20 on account of the high temperatures during oxidation and lead to an increase in the dopant concentration in the layer. As a result, the rise in the dopant concentration to the region of the later body region 3 or the surface 22 is formed in the region of the drift zone 2. At the same time, the dopant diffuses from the trenches 80 laterally into the epitaxial layer 20, so that an inhomogeneous dopant profile is thereby also formed in the lateral direction. Further subsequent thermal steps, for example for forming the source region 4 and the body terminal region 26, likewise contribute to the segregation. More precisely, a segregation that dominates the doping profile can be produced by firstly growing, in the entire trench and at the surface, a thick oxide having the thickness of the oxide at the trench bottom, which is removed again in the upper region of the trench and at the surface. The gate oxide is subsequently grown, whereby the segregation can also be amplified.

The variation of the dopant concentration can be reduced in the first time segment for example proceeding from approximately $2*10^{17}$ cm$^{-3}$ to a value of between approximately $7*10^{15}$ cm$^{-3}$ and $1*10^{16}$ cm$^{-3}$. The duration of the first time segment is chosen for example in such a way that in the first time segment a partial layer grows which reaches as far as approximately the center of the drift zone to be formed. In the second time segment, which leads to a partial layer having a thickness of approximately 1.5 µm, the concentration remains for example at a constant level of between approximately $7*10^{15}$ cm$^{-3}$ and $1*10^{16}$ cm$^{-3}$. In the third time segment, it is then possible to form a partial layer having a thickness of approximately 1.5 µm to approximately 2 µm and with a dopant concentration of, for example approximately $4*10^{16}$ cm$^{-3}$ to approximately $6*10^{16}$ cm$^{-3}$. In the third time segment, the dopant concentration can also grow to this value. The increased dopant concentration set in the third time segment then leads, on account of the thermal treatments, to a washing out of the profiles and a pile-up effect, whereby the required rise to the body region is formed. As a result, it is possible to achieve for example a concentration of $6*10^{16}$ cm$^{-3}$ to greater than $1*10^{17}$ cm$^{-3}$ at the pn junction and at the same time a doping of $4*10^{16}$ cm$^{-3}$ to $1*10^{17}$ cm$^{-3}$ at the minimum.

The variants described above can, of course, also be combined in a suitable manner. By way of example, the concentration of the supplied dopants can be increased or decreased continuously, for example, linearly, in one time segment, while stepped profiles are produced in other time segments. An amplifying implantation may additionally be carried out. The formation of the minimum by means of the segregation described above may also be combined with the other measures.

As an alternative, or in addition thereto, it is possible to introduce compensation dopants where on the other hand a minimum is desired in the doping profile of the first conduction type. This may already be effected during the deposition of the epitaxial layer 20, for example, by additionally supplying a boron-containing compound, for example. As an alternative, boron may be introduced by means of a high-energy implantation. An additional compensation doping profile with a maximum is formed as a result. However, the concentration of the introduced boron is lower than that of the dopant of the first conduction type, so that the epitaxial layer 20 still remains n-conducting. The n-type doping can be kept constant in this case. However, it is also possible for the n-type doping to be formed differently by varying the concentration of the supplied n-type dopant in the vertical direction.

Figure 14B:
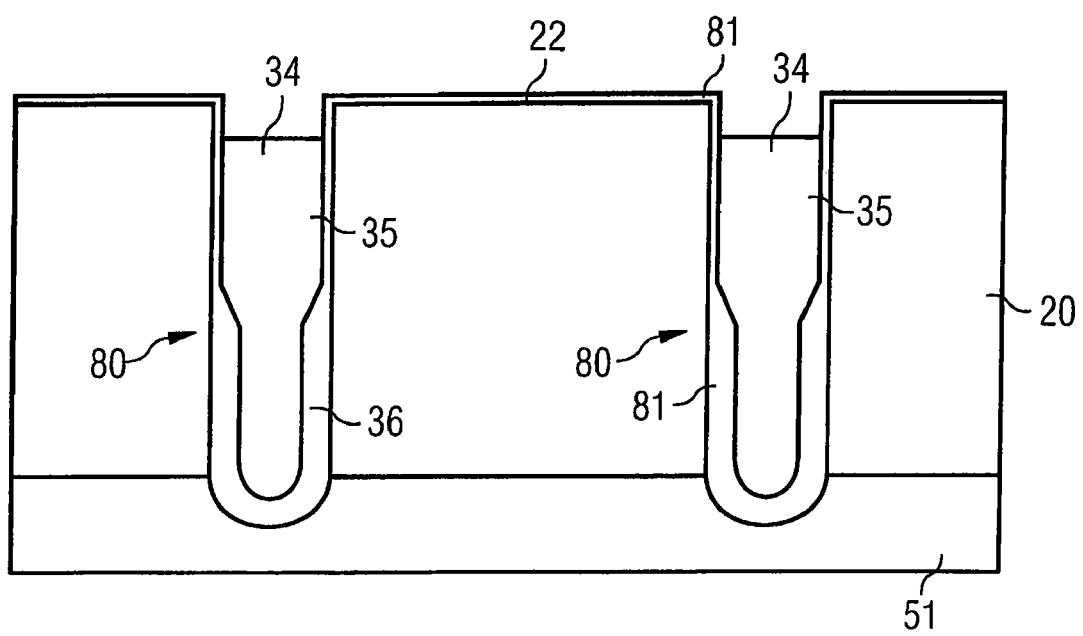

After the formation of the trenches 80 and the oxidation of regions near the surface in order to form the dielectric layer 36, a gate electrode 35 is formed in the trenches 80. The structure thus obtained is shown in FIG. 14B.

Figure 14C:
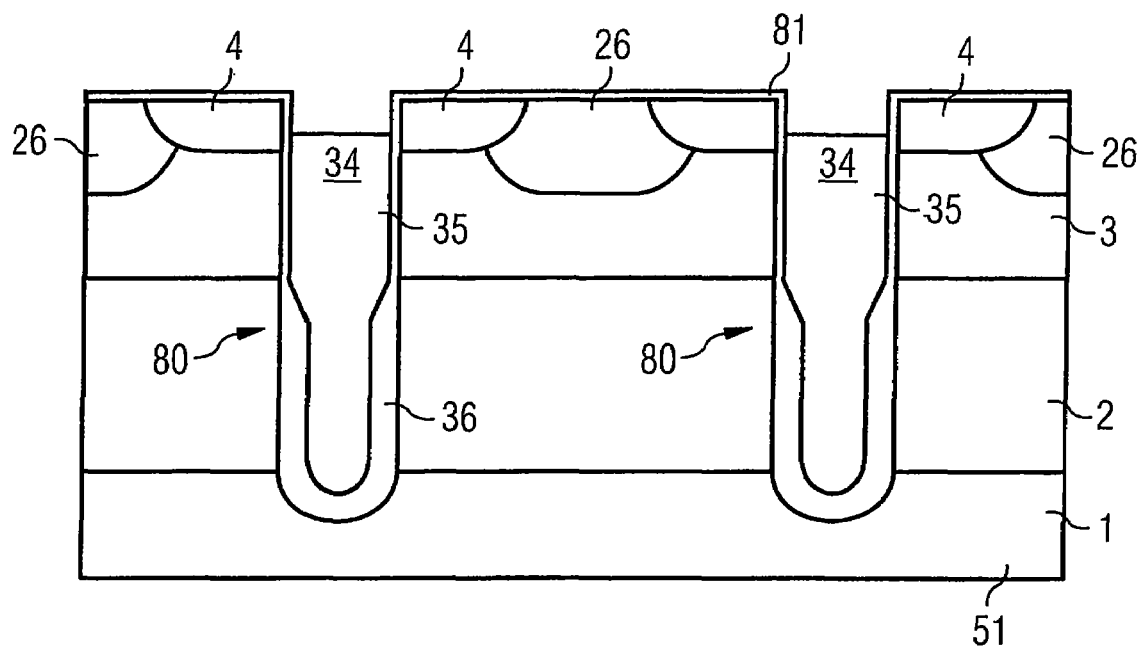

This is followed by the formation of the body region 3, the source region 4 and the body terminal region 26 by implantation using suitable masks. By way of example, boron may be used for the body region 3 and the body terminal region 26. By contrast, phosphorus or arsenic may be used for the source region 4. The implanted dopants are subsequently thermally activated. The structure thus obtained is shown in FIG. 14C.

Figure 14D:
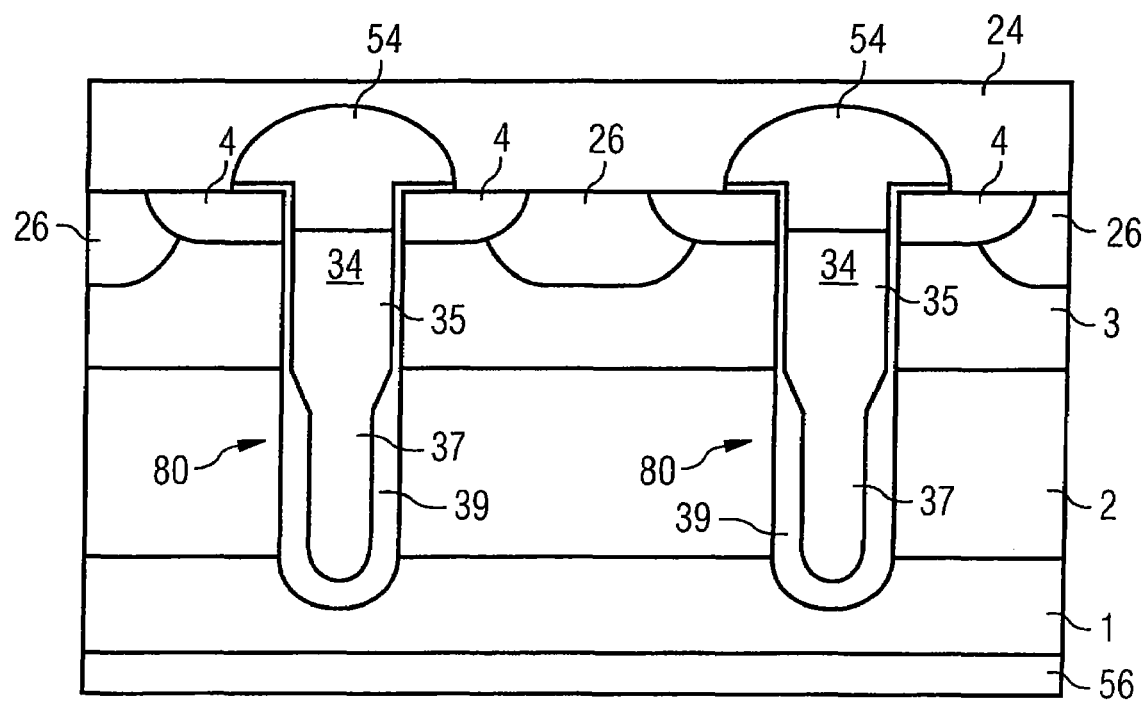

FIG. 14D schematically illustrates the concluding steps, wherein an insulation region 54 is applied to the gate electrode 35 in order to electrically insulate the latter from a metalization 24, which makes contact with the source region 3 and the body terminal region 26.

A modified production method proceeds from a weakly p-doped semiconductor substrate (for example monocrystalline silicon), at the top side of which a heavily n-doped drain zone is formed by implantation using a mask. In addition, it is possible to produce a highly doped terminal region for the p-type semiconductor substrate by means of implantation. Afterward, the epitaxial layer 20 is then grown onto the semiconductor substrate, as described above. Further highly doped terminal regions for the p-type semiconductor substrate and the now buried drain zone are implanted. By means of a suitable thermal step, the terminal regions diffuse together vertically and form "sinkers" extending from the top side of the epitaxial layer 20 as far as the buried drain zone or as far as the p-type semiconductor substrate that is likewise covered by the epitaxial layer 20. Body region 3, source region 4 and the trench structures 30 can likewise be produced as described above. A structure of this type is shown in FIG. 12.

The embodiments described previously comprise an epitaxial layer for forming the second semiconductor region. As an alternative, an epitaxial deposition can be dispensed with, however. In this case, a solid monocrystalline semiconductor body is taken as a basis, into which the respective semiconductor regions are implanted and indiffused. In addition, the semiconductor body is thinned in order, in particular, to set the thickness of the second semiconductor region. In this case, the second semiconductor region is formed by the region in the semiconductor body which lies between the first and second semiconductor region. This procedure has the advantage that the complicated and costly epitaxial deposition can be dispensed with. In addition, the on resistivity $R_{on}*A$ can furthermore be reduced further, since the substrate resistance is dropped in the case of the thinned semiconductor bodies.

An example of a method of this type is shown in FIGS. 17A and 17B. The starting point is a solid semiconductor body 90 having a constant n-type doping, for example. The semiconductor body 90 is typically present as a monocrystalline substrate wafer.

Trenches 80 are subsequently introduced into the substrate wafer (semiconductor body) 90 by means of anisotropic etching, and a two-stage process involves for example thermal oxidation of a thick field oxide 39 in the lower region and a thin gate dielectric 38 in comparison therewith in the upper region of the trenches 80. This is followed by the production of the electrode structures 34 with gate electrode 35 and field plate 37 in the trenches 80, in which case the electrode structures 34 may be covered with an oxide layer. The third semiconductor region 3 (body region) is then formed by implantation of boron, for example, into the top side 22 and subsequent thermal treatment. In the upper region—facing the body region 3—of the drift zone 2 which is adjacent below the body region 3 in the semiconductor body 90, n-type dopant, for example phosphorus or arsenic, is additionally implanted, and if appropriate thermally outdiffused, in order to form the body-side rise in dopant in the drift zone 2. The position of the implanted n-type dopant 91 is indicated schematically by 91 in FIG. 17A. It is likewise possible firstly to implant the p-type and n-type dopant 91 and then to carry out a joint thermal treatment. As an alternative, it is possible to carry out a thermal treatment only after implantation of all the dopants, as described further below. A structure produced in this way is shown in FIG. 17A.

The substrate wafer 90 is subsequently applied by its top side 22 to a carrier (not shown) in a releasable manner. This serves to stabilize the substrate wafer 90 during the subsequent mechanical grinding and etching of the rear side 16. The substrate wafer 90 may be thinned by means of a CMP method, for example, wherein the bottom of the trenches 80 may serve as a grinding stop. Typically, however, the thinning is already stopped prior to uncovering the bottom, in order that semiconductor material still remains below the trenches 80. After thinning the substrate wafer 90 may have a thickness of between approximately 5 μm and 20 μm.

This is followed by the implantation of an n-type dopant into the rear side 16 in order to form the rear-side (substrate-side or drain-side) rise in the dopant concentration in the drift zone 2. The position of the dopant introduced from the rear side 16 is designated by 92 in FIG. 17B. The thermal outdiffusion of the introduced dopant subsequently takes place. This thermal treatment may also be the first outdiffusion step for the body region 3 and the body-side rise in the dopant concentration in the drift zone 2. It should be taken into consideration that the carrier and its connection to the substrate wafer 90 are suitable for the process conditions chosen, and in particular are resistant to high temperatures.

This is followed by the implantation of n-type dopant into the rear side 16 in order to form the first semiconductor region (drain zone) 3. By way of example, the introduced dopant can be activated by a laser annealing in order that the thermal loading of the structures on the top side 22 is kept low.

A carrier (not illustrated) is then applied to the rear side 16 and the carrier is removed from the front side 22. This is followed by the implantation of n-type dopant for forming the fourth semiconductor region (source zone) 4 and p-type dopant (body terminal region) 26 into the top side 22. By means of a subsequent thermal treatment, the dopants are activated and, if appropriate, outdiffused. It is favorable if these steps are already effected prior to the thinning of the substrate wafer 90. However, the subsequent steps should then no longer require a very high temperature budget in order to avoid an excessively great outdiffusion from source zone 4 and body terminal region 26.

Furthermore, after the formation of insulation regions 54 above the trenches 80, a metallization 24 is applied to the top side 22 and patterned. After renewed application of a carrier to the top side 22 and removal of the rear-side carrier, a metalization for forming the rear-side contact 56 is likewise applied on the rear side 16 and patterned. The finished structure is shown in FIG. 17B.

Figure 18A:
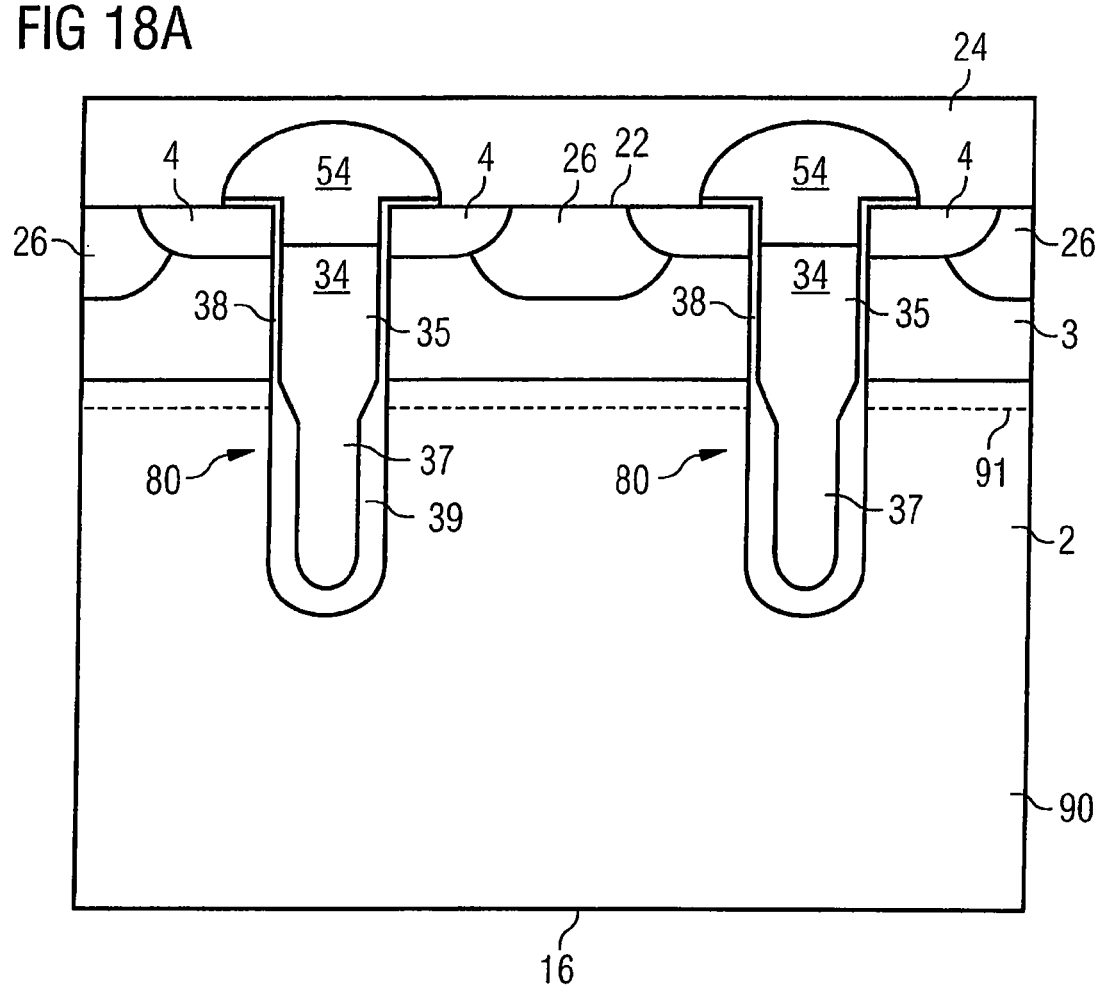
FIGS. 18A and 18B show individual method steps of a further method for producing a semiconductor component.
Figure 18B:
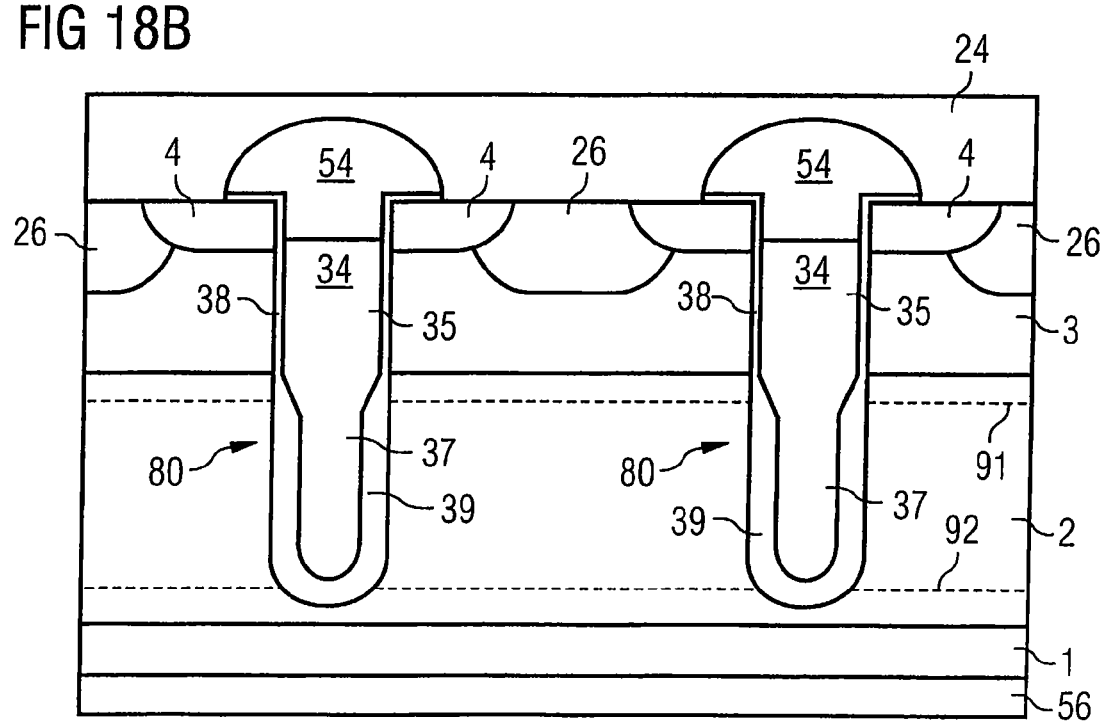

A method variant is explained below with reference to FIGS. 18A and 18B. The starting point here is again a solid substrate wafer 90. Firstly, trenches 80 with field oxide 39, gate dielectric 38 and electrode structures 34 are likewise formed as described above. This is followed by the formation of body region 3, source zone 4, body terminal region 26 and body-side rise in the dopant concentration. A metalization 24 is then subsequently formed. A structure of this type is shown in FIG. 18A. It is also possible initially to dispense with the implantation of the body-side rise in the dopant concentration.

A carrier is then applied to the top side 22 and the substrate wafer 90 is thinned on the rear side. The rear-side and, if it has not yet taken place, also the body-side rise in the dopant concentration in the source zone 2 is formed by implantation of protons (hydrogen) and a suitable heat treatment. Owing to the large range of protons, the implantation can be effected both from the top side 22 and from the rear side 16. After a heat treatment at approximately 350° C. to 420° C., implanted protons lead to defects that act like n-type impurities. Finally, an implantation of n-type dopant for forming the drain zone 1 may be effected on the rear side. This is followed by the formation of a rear-side contact 56. The finished structure is shown in FIG. 18B.

The proton implantation opens up a further advantage. During heat treatment at 350° C. to 380° C., an n-type doping is produced in the end-of-range of the implantation and a p-type doping is produced at smaller penetration depths. As a result, it is possible simultaneously to produce an n-type maximum for the n-type rise and also a p-type maximum for the compensation doping in the drift zone by means of proton implantation during implantation into the top side 22.

Instead of the n-type implantation and the proton implantation for forming the rises in the dopant concentration in the source zone 2, it is also possible to carry out p-type implantation for forming a compensation doping in the source zone 2. This may be effected, for example after the thinning of the wafer from the rear side 16, or by means of a high-energy implantation from the top side 22.

What is claimed is:

1. A method for producing a semiconductor component comprising:
    forming a first semiconductor region of a first conduction type;
    forming a second semiconductor region of the first conduction type, wherein the second semiconductor region has a lower dopant concentration than the first semiconductor region;
    forming a third semiconductor region of a second conduction type, which is complementary to the first conduction type,
    wherein the semiconductor regions are formed such that
        the second semiconductor region is arranged between the first and the third semiconductor regions, and together with the first semiconductor region forms a first junction region and together with the third semiconductor region forms a second junction region, and
        the second semiconductor region has an inhomogeneous dopant profile along a straight connecting line between the first and third semiconductor regions, with at least one minimum between the first and second junction region, wherein the minimum is at a distance from the first and second junction region;
    providing a substrate having the first semiconductor region;
    depositing a semiconductor layer of the first conduction type onto the first semiconductor region by means of epitaxy, wherein the semiconductor layer has an inhomogeneous dopant distribution with a minimum in the growth direction; and
    forming the third semiconductor region spaced apart from the first semiconductor region in the upper region of the semiconductor layer with formation of the second junction region,
    wherein during the deposition of the semiconductor layer the concentration of the supplied dopant is reduced only during a first time segment or during the entire deposition, and wherein afterward, by oxidation of uncovered surface regions of the semiconductor layer, dopant from the oxidized surface regions is segregated into non-oxidized regions in order to form the minimum.

2. A method for producing a semiconductor component comprising:
    forming a first semiconductor region of a first conduction type;

forming a second semiconductor region of the first conduction type, wherein the second semiconductor region has a lower dopant concentration than the first semiconductor region;

forming a third semiconductor region of a second conduction type, which is complementary to the first conduction type, wherein the semiconductor regions are formed such that
the second semiconductor region is arranged between the first and the third semiconductor regions, and together with the first semiconductor region forms a first junction region and together with the third semiconductor region forms a second junction region, and
the second semiconductor region has an inhomogeneous dopant profile along a straight connecting line between the first and third semiconductor regions, with at least one minimum between the first and second junction region, wherein the minimum is at a distance from the first and second junction region;

providing a substrate having the first semiconductor region;

depositing a semiconductor layer of the first conduction type onto the first semiconductor region by means of epitaxy, wherein the semiconductor layer has an inhomogeneous dopant distribution with a minimum in the growth direction; and forming the third semiconductor region spaced apart from the first semiconductor region in the upper region of the semiconductor layer with formation of the second junction region, wherein during the deposition of the semiconductor layer at least one dopant is supplied and the concentration of the supplied dopant is varied in such a way as to form the inhomogeneous dopant distribution with the minimum.

3. The method as claimed in claim 2, wherein
the concentration of the supplied dopant during the deposition of the semiconductor layer decreases down to a minimum value during a first time segment,
is then kept largely constant at the minimum value during a second time segment, and
is subsequently set to at least a largely constant value, which is higher than the minimum value, during a third time segment.

4. The method as claimed in claim 2, wherein
the concentration of the supplied dopant during the deposition of the semiconductor layer decreases down to a minimum value during a first time segment,
is then kept largely constant at the minimum value or reduced further during a second time segment, and
after the completion of the semiconductor layer at least one dopant of the first conduction type is implanted into the semiconductor layer.

5. The method as claimed in claim 4, wherein the implantation of the dopant of the first conduction type is carried out such that the maximum of the implantation lies substantially below the third semiconductor region.

6. A method for producing a semiconductor component comprising:
forming a first semiconductor region of a first conduction type;
forming a second semiconductor region of the first conduction type, wherein the second semiconductor region has a lower dopant concentration than the first semiconductor region;
forming a third semiconductor region of a second conduction type, which is complementary to the first conduction type,
wherein the semiconductor regions are formed such that
the second semiconductor region is arranged between the first and the third semiconductor regions, and together with the first semiconductor region forms a first junction region and together with the third semiconductor region forms a second junction region, and
the second semiconductor region has an inhomogeneous dopant profile along a straight connecting line between the first and third semiconductor regions, with at least one minimum between the first and second junction region, wherein the minimum is at a distance from the first and second junction region providing a substrate having the first semiconductor region;

depositing a semiconductor layer of the first conduction type onto the first semiconductor region by means of epitaxy, wherein the semiconductor layer has an inhomogeneous dopant distribution with a minimum in the growth direction; and forming the third semiconductor region spaced apart from the first semiconductor region in the upper region of the semiconductor layer with formation of the second junction region, wherein during the deposition of the semiconductor layer the concentration of the supplied dopant is reduced only during a first time segment or during the entire deposition, and wherein afterward, by oxidation of uncovered surface regions of the semiconductor layer, dopant from the oxidized surface regions is segregated into the region of the second junction region to be formed, in order to form the minimum.

7. The method as claimed in claim 1, wherein
the third semiconductor region is formed by implantation and indiffusion or by thermal activation of the dopant,
trench structures are produced in the semiconductor layer wherein the trench structures completely penetrate through the third semiconductor region that has been formed or is subsequently to be formed, and extend deeper than the third semiconductor region, wherein mesa structures remain between the trench structures, and
uncovered surfaces of the trench structures and the semiconductor layer or semiconducting regions are oxidized.

8. The method as claimed in claim 2, wherein the decrease in the dopant concentration during the deposition of the semiconductor layer is set such that, in the semiconductor layer, the dopant concentration decreases from approximately $2*10^{17}$ cm$^{-3}$ at the first junction region to a value of between approximately $7*10^{15}$ cm$^{-3}$ and approximately $1*10^{17}$ cm$^{-3}$ at the minimum.

9. The method as claimed in claim 1, wherein the dopant concentration is varied in a stepwise fashion.

10. The method as claimed in claim 1, further comprising:
providing a semiconductor body of the first conduction type;
forming the third semiconductor region in that region of the semiconductor body which is near the top side, with formation of the second junction region with respect to the semiconductor body;
thinning the semiconductor body at the rear side thereof;
forming the first semiconductor region in that region of the semiconductor body which is near the rear side, so that the first semiconductor region has a higher dopant concentration than the semiconductor body; and forming the inhomogeneous dopant profile of the first conduction type with a minimum in the semiconductor body between the first junction region and the second junction region by implantation.

11. The method as claimed in claim 10, wherein a rise in the dopant concentration of the first conduction type in the semiconductor body in the direction of the second junction region is formed by implantation into the top side of the semiconductor body prior to the thinning of the semiconductor body.

12. A method for producing a semiconductor component comprising:

forming a first semiconductor region of a first conduction type;

forming a second semiconductor region of the first conduction type, wherein the second semiconductor region has a lower dopant concentration than the first semiconductor region;

forming a third semiconductor region of a second conduction type, which is complementary to the first conduction type, wherein the semiconductor regions are formed such that
the second semiconductor region is arranged between the first and the third semiconductor regions, and together with the first semiconductor region forms a first junction region and together with the third semiconductor region forms a second junction region, and
the second semiconductor region has an inhomogeneous dopant profile along a straight connecting line between the first and third semiconductor regions, with at least one minimum between the first and second junction region, wherein the minimum is at a distance from the first and second junction region;

providing a semiconductor body of the first conduction type;

forming the third semiconductor region in that region of the semiconductor body which is near the top side, with formation of the second junction region with respect to the semiconductor body;

thinning the semiconductor body at the rear side thereof;

forming the first semiconductor region in that region of the semiconductor body which is near the rear side, so that the first semiconductor region has a higher dopant concentration than the semiconductor body; and forming the inhomogeneous dopant profile of the first conduction type with a minimum in the semiconductor body between the first junction region and the second junction region by implantation, wherein a rise in the dopant concentration of the first conduction type in the semiconductor body in the direction of the first junction region is formed by implantation into the rear side of the semiconductor body after the thinning of the semiconductor body.

13. The method as claimed in claim 10, wherein a dopant of the first conduction type or protons are implanted for the purpose of forming the rise.

14. The method as claimed in claim 12, wherein a dopant of the first conduction type or protons are implanted for the purpose of forming the rise.

* * * * *